(12) United States Patent
Lee

(10) Patent No.: US 8,094,488 B2
(45) Date of Patent: *Jan. 10, 2012

(54) SET ALGORITHM FOR PHASE CHANGE MEMORY CELL

(75) Inventor: Ming-Hsiu Lee, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 12/965,126

(22) Filed: Dec. 10, 2010

(65) Prior Publication Data

US 2011/0075475 A1    Mar. 31, 2011

Related U.S. Application Data

(63) Continuation of application No. 12/345,384, filed on Dec. 29, 2008, now Pat. No. 7,869,270.

(51) Int. Cl.
*G11C 11/00* (2006.01)
(52) U.S. Cl. .... 365/163; 365/148; 365/158; 365/185.18
(58) Field of Classification Search .................. 365/163, 365/148, 158, 185.18, 185.19
See application file for complete search history.

(56) References Cited

U.S. PATENT DOCUMENTS

| | | | |
|---|---|---|---|
| 3,271,591 A | 9/1966 | Ovshinsky |
| 3,530,441 A | 9/1970 | Ovshinsky |
| 4,452,592 A | 6/1984 | Tsai |
| 4,599,705 A | 7/1986 | Holmberg et al. |
| 4,719,594 A | 1/1988 | Young et al. |
| 4,769,339 A | 9/1988 | Ishii |
| 4,876,220 A | 10/1989 | Mohsen et al. |
| 4,959,812 A | 9/1990 | Momodomi et al. |
| 5,106,775 A | 4/1992 | Kaga et al. |
| 5,166,096 A | 11/1992 | Cote et al. |
| 5,166,758 A | 11/1992 | Ovshinsky et al. |
| 5,177,567 A | 1/1993 | Klersy et al. |
| 5,332,923 A | 7/1994 | Takeuchi |
| 5,391,901 A | 2/1995 | Tanabe |

(Continued)

FOREIGN PATENT DOCUMENTS

WO        0079539 A1    12/2000

(Continued)

OTHER PUBLICATIONS

"Magnetic Bit Boost," www.sciencenews.org, Dec. 18 & 25, 2004, p. 389, vol. 166.

(Continued)

*Primary Examiner* — David Lam
(74) *Attorney, Agent, or Firm* — Haynes Beffel & Wolfeld LLP

(57) ABSTRACT

Memory devices and methods for operating such devices are described herein. A method is described herein for operating a memory cell comprising phase change material and programmable to a plurality of resistance states including a high resistance state and a lower resistance state. The method comprises applying a first bias arrangement to the memory cell to establish the lower resistance state, the first bias arrangement comprising a first voltage pulse. The method further comprises determining whether the memory cell is in the lower resistance state, and if the memory cell is not in the lower resistance state then applying a second bias arrangement to the memory cell. The second bias arrangement comprises a second voltage pulse having a pulse height greater than that of the first voltage pulse.

20 Claims, 13 Drawing Sheets

U.S. PATENT DOCUMENTS

| | | | |
|---|---|---|---|
| 5,515,488 A | 5/1996 | Hoppe et al. |
| 5,534,712 A | 7/1996 | Ovshinsky et al. |
| 5,550,396 A | 8/1996 | Tsutsumi |
| 5,687,112 A | 11/1997 | Ovshinsky |
| 5,688,713 A | 11/1997 | Linliu et al. |
| 5,716,883 A | 2/1998 | Tseng |
| 5,754,472 A | 5/1998 | Sim |
| 5,789,277 A | 8/1998 | Zahorik et al. |
| 5,789,758 A | 8/1998 | Reinberg |
| 5,814,527 A | 9/1998 | Wolstenholme et al. |
| 5,831,276 A | 11/1998 | Gonzalez et al. |
| 5,837,564 A | 11/1998 | Sandhu et al. |
| 5,869,843 A | 2/1999 | Harshfield |
| 5,879,955 A | 3/1999 | Gonzalez et al. |
| 5,902,704 A | 5/1999 | Schoenborn et al. |
| 5,920,788 A | 7/1999 | Reinberg |
| 5,933,365 A | 8/1999 | Klersy et al. |
| 5,952,671 A | 9/1999 | Reinberg et al. |
| 5,958,358 A | 9/1999 | Tenne et al. |
| 5,970,336 A | 10/1999 | Wolstenholme et al. |
| 5,985,698 A | 11/1999 | Gonzalez et al. |
| 5,998,244 A | 12/1999 | Wolstenholme et al. |
| 6,011,725 A | 1/2000 | Eitan |
| 6,025,220 A | 2/2000 | Sandhu |
| 6,031,287 A | 2/2000 | Harshfield |
| 6,034,882 A | 3/2000 | Johnson et al. |
| 6,046,951 A | 4/2000 | El Hajji |
| 6,066,870 A | 5/2000 | Siek |
| 6,077,674 A | 6/2000 | Schleifer et al. |
| 6,077,729 A | 6/2000 | Harshfield |
| 6,087,269 A | 7/2000 | Williams |
| 6,087,674 A | 7/2000 | Ovshinsky et al. |
| 6,104,038 A | 8/2000 | Gonzalez et al. |
| 6,111,264 A | 8/2000 | Wolstenholme et al. |
| 6,114,713 A | 9/2000 | Zahorik |
| 6,117,720 A | 9/2000 | Harshfield |
| 6,147,395 A | 11/2000 | Gilgen |
| 6,150,253 A | 11/2000 | Doan et al. |
| 6,153,890 A | 11/2000 | Wolstenholme et al. |
| 6,177,317 B1 | 1/2001 | Huang et al. |
| 6,185,122 B1 | 2/2001 | Johnson et al. |
| 6,189,582 B1 | 2/2001 | Reinberg et al. |
| 6,236,059 B1 | 5/2001 | Wolstenholme et al. |
| RE37,259 E | 7/2001 | Ovshinsky |
| 6,271,090 B1 | 8/2001 | Huang et al. |
| 6,280,684 B1 | 8/2001 | Yamada et al. |
| 6,287,887 B1 | 9/2001 | Gilgen |
| 6,291,137 B1 | 9/2001 | Lyons et al. |
| 6,314,014 B1 | 11/2001 | Lowrey et al. |
| 6,316,348 B1 | 11/2001 | Fu et al. |
| 6,320,786 B1 | 11/2001 | Chang et al. |
| 6,326,307 B1 | 12/2001 | Lindley et al. |
| 6,337,266 B1 | 1/2002 | Zahorik |
| 6,339,544 B1 | 1/2002 | Chiang et al. |
| 6,351,406 B1 | 2/2002 | Johnson et al. |
| 6,372,651 B1 | 4/2002 | Yang et al. |
| 6,380,068 B2 | 4/2002 | Jeng et al. |
| 6,420,215 B1 | 7/2002 | Knall et al. |
| 6,420,216 B1 | 7/2002 | Clevenger et al. |
| 6,420,725 B1 | 7/2002 | Harshfield |
| 6,423,621 B2 | 7/2002 | Doan et al. |
| 6,429,064 B1 | 8/2002 | Wicker |
| 6,440,837 B1 | 8/2002 | Harshfield |
| 6,462,353 B1 | 10/2002 | Gilgen |
| 6,483,736 B2 | 11/2002 | Johnson et al. |
| 6,487,106 B1 | 11/2002 | Kozicki |
| 6,487,114 B2 | 11/2002 | Jong et al. |
| 6,501,111 B1 | 12/2002 | Lowrey |
| 6,511,867 B2 | 1/2003 | Lowrey et al. |
| 6,512,241 B1 | 1/2003 | Lai |
| 6,514,788 B2 | 2/2003 | Quinn |
| 6,514,820 B2 | 2/2003 | Ahn et al. |
| 6,534,781 B2 | 3/2003 | Dennison |
| 6,545,903 B1 | 4/2003 | Wu |
| 6,551,866 B1 | 4/2003 | Maeda |
| 6,555,860 B2 | 4/2003 | Lowrey et al. |
| 6,563,156 B2 | 5/2003 | Harshfield |
| 6,566,700 B2 | 5/2003 | Xu |
| 6,567,293 B1 | 5/2003 | Lowrey et al. |
| 6,576,546 B2 | 6/2003 | Gilbert et al. |
| 6,579,760 B1 | 6/2003 | Lung |
| 6,586,761 B2 | 7/2003 | Lowrey |
| 6,589,714 B2 | 7/2003 | Maimon et al. |
| 6,593,176 B2 | 7/2003 | Dennison |
| 6,596,589 B2 | 7/2003 | Tseng |
| 6,597,009 B2 | 7/2003 | Wicker |
| 6,605,527 B2 | 8/2003 | Dennison et al. |
| 6,605,821 B1 | 8/2003 | Lee et al. |
| 6,607,974 B2 | 8/2003 | Harshfield |
| 6,613,604 B2 | 9/2003 | Maimon et al. |
| 6,617,192 B1 | 9/2003 | Lowrey et al. |
| 6,621,095 B2 | 9/2003 | Chiang et al. |
| 6,627,530 B2 | 9/2003 | Li et al. |
| 6,639,849 B2 | 10/2003 | Takahashi et al. |
| 6,673,700 B2 | 1/2004 | Dennison et al. |
| 6,674,115 B2 | 1/2004 | Hudgens et al. |
| 6,677,678 B2 | 1/2004 | Biolsi et al. |
| 6,744,088 B1 | 6/2004 | Dennison |
| 6,750,079 B2 | 6/2004 | Lowrey et al. |
| 6,750,101 B2 | 6/2004 | Lung |
| 6,791,102 B2 | 9/2004 | Johnson et al. |
| 6,797,979 B2 | 9/2004 | Chiang et al. |
| 6,800,504 B2 | 10/2004 | Li et al. |
| 6,800,563 B2 | 10/2004 | Xu |
| 6,815,704 B1 | 11/2004 | Chen |
| 6,838,692 B1 | 1/2005 | Lung |
| 6,850,432 B2 | 2/2005 | Lu et al. |
| 6,859,389 B2 | 2/2005 | Idehara |
| 6,861,267 B2 | 3/2005 | Xu et al. |
| 6,864,500 B2 | 3/2005 | Gilton |
| 6,864,503 B2 | 3/2005 | Lung |
| 6,867,638 B2 | 3/2005 | Saiki et al. |
| 6,881,603 B2 | 4/2005 | Lai |
| 6,888,750 B2 | 5/2005 | Walker et al. |
| 6,894,304 B2 | 5/2005 | Moore |
| 6,894,305 B2 | 5/2005 | Yi et al. |
| 6,900,517 B2 | 5/2005 | Tanaka et al. |
| 6,903,362 B2 | 6/2005 | Wyeth et al. |
| 6,909,107 B2 | 6/2005 | Rodgers et al. |
| 6,910,907 B2 | 6/2005 | Layadi et al. |
| 6,927,410 B2 | 8/2005 | Chen |
| 6,928,022 B2 | 8/2005 | Cho et al. |
| 6,930,909 B2 | 8/2005 | Moore et al. |
| 6,933,516 B2 | 8/2005 | Xu |
| 6,936,544 B2 | 8/2005 | Huang et al. |
| 6,936,840 B2 | 8/2005 | Sun et al. |
| 6,937,507 B2 | 8/2005 | Chen |
| 6,943,365 B2 | 9/2005 | Lowrey et al. |
| 6,969,866 B1 | 11/2005 | Lowrey et al. |
| 6,972,428 B2 | 12/2005 | Maimon |
| 6,972,430 B2 | 12/2005 | Casagrande et al. |
| 6,977,181 B1 | 12/2005 | Raberg |
| 6,992,932 B2 | 1/2006 | Cohen |
| 7,023,009 B2 | 4/2006 | Kostylev et al. |
| 7,033,856 B2 | 4/2006 | Lung |
| 7,038,230 B2 | 5/2006 | Chen et al. |
| 7,038,938 B2 | 5/2006 | Kang |
| 7,042,001 B2 | 5/2006 | Kim et al. |
| 7,054,183 B2 | 5/2006 | Rinerson et al. |
| 7,067,837 B2 | 6/2006 | Hwang et al. |
| 7,067,864 B2 | 6/2006 | Nishida et al. |
| 7,067,865 B2 | 6/2006 | Lung |
| 7,078,273 B2 | 7/2006 | Matsuoka et al. |
| 7,085,154 B2 | 8/2006 | Cho et al. |
| 7,099,180 B1 | 8/2006 | Dodge et al. |
| 7,115,927 B2 | 10/2006 | Hideki et al. |
| 7,122,281 B2 | 10/2006 | Pierrat |
| 7,122,824 B2 | 10/2006 | Khouri et al. |
| 7,126,149 B2 | 10/2006 | Iwasaki et al. |
| 7,132,675 B2 | 11/2006 | Gilton |
| 7,151,273 B2 | 12/2006 | Campbell et al. |
| 7,154,774 B2 | 12/2006 | Bedeschi et al. |
| 7,158,411 B2 | 1/2007 | Yeh et al. |
| 7,164,147 B2 | 1/2007 | Lee et al. |
| 7,166,533 B2 | 1/2007 | Happ |
| 7,169,635 B2 | 1/2007 | Kozicki |
| 7,180,771 B2 | 2/2007 | Cho et al. |

| | | | | | | |
|---|---|---|---|---|---|---|
| 7,190,607 B2 | 3/2007 | Cho et al. | | 2006/0118913 A1 | 6/2006 | Yi et al. |
| 7,202,493 B2 | 4/2007 | Lung | | 2006/0124916 A1 | 6/2006 | Lung |
| 7,208,751 B2 | 4/2007 | Ooishi | | 2006/0126395 A1 | 6/2006 | Chen et al. |
| 7,214,958 B2 | 5/2007 | Happ | | 2006/0131555 A1 | 6/2006 | Liu et al. |
| 7,220,983 B2 | 5/2007 | Lung | | 2006/0138467 A1 | 6/2006 | Lung |
| 7,229,883 B2 | 6/2007 | Wang et al. | | 2006/0154185 A1 | 7/2006 | Ho et al. |
| 7,238,959 B2 | 7/2007 | Chen | | 2006/0157681 A1 | 7/2006 | Chen et al. |
| 7,238,994 B2 | 7/2007 | Chen et al. | | 2006/0163554 A1 | 7/2006 | Lankhorst et al. |
| 7,248,494 B2 | 7/2007 | Oh et al. | | 2006/0172067 A1 | 8/2006 | Ovshinsky et al. |
| 7,251,157 B2 | 7/2007 | Osada et al. | | 2006/0175599 A1 | 8/2006 | Happ |
| 7,253,429 B2 | 8/2007 | Klersy et al. | | 2006/0198183 A1 | 9/2006 | Kawahara et al. |
| 7,254,059 B2 | 8/2007 | Li et al. | | 2006/0205108 A1 | 9/2006 | Maimon et al. |
| 7,269,052 B2 | 9/2007 | Segal et al. | | 2006/0211165 A1 | 9/2006 | Hwang et al. |
| 7,277,317 B2 | 10/2007 | Le Phan | | 2006/0226409 A1 | 10/2006 | Burr et al. |
| 7,440,308 B2 | 10/2007 | Jeong et al. | | 2006/0234138 A1 | 10/2006 | Fehlhaber et al. |
| 7,291,556 B2 | 11/2007 | Choi et al. | | 2006/0237756 A1 | 10/2006 | Park et al. |
| 7,309,630 B2 | 12/2007 | Fan et al. | | 2006/0245236 A1 | 11/2006 | Zaidi |
| 7,321,130 B2 | 1/2008 | Lung et al. | | 2006/0250885 A1 | 11/2006 | Cho et al. |
| 7,323,708 B2 | 1/2008 | Lee et al. | | 2006/0261392 A1 | 11/2006 | Lee et al. |
| 7,332,370 B2 | 2/2008 | Chang et al. | | 2006/0266993 A1 | 11/2006 | Suh et al. |
| 7,336,526 B2 | 2/2008 | Osada et al. | | 2006/0284157 A1 | 12/2006 | Chen et al. |
| 7,351,648 B2 | 4/2008 | Furukawa et al. | | 2006/0284158 A1 | 12/2006 | Lung et al. |
| 7,359,231 B2 | 4/2008 | Venkataraman et al. | | 2006/0284214 A1 | 12/2006 | Chen |
| 7,364,935 B2 | 4/2008 | Lung | | 2006/0284279 A1 | 12/2006 | Lung et al. |
| 7,365,385 B2 | 4/2008 | Abbott | | 2006/0286709 A1 | 12/2006 | Lung et al. |
| 7,379,328 B2 | 5/2008 | Osada et al. | | 2006/0286743 A1 | 12/2006 | Lung et al. |
| 7,385,235 B2 | 6/2008 | Lung | | 2006/0289848 A1 | 12/2006 | Dennison |
| 7,394,088 B2 | 7/2008 | Lung | | 2007/0008786 A1 | 1/2007 | Scheuerlein |
| 7,397,060 B2 | 7/2008 | Lung | | 2007/0030721 A1 | 2/2007 | Segal et al. |
| 7,423,300 B2 | 9/2008 | Lung et al. | | 2007/0037101 A1 | 2/2007 | Morioka |
| 7,426,134 B2 | 9/2008 | Happ et al. | | 2007/0096162 A1 | 5/2007 | Happ et al. |
| 7,449,710 B2 | 11/2008 | Lung | | 2007/0096248 A1 | 5/2007 | Philipp et al. |
| 7,473,576 B2 | 1/2009 | Lung | | 2007/0108077 A1 | 5/2007 | Lung et al. |
| 7,479,649 B2 | 1/2009 | Lung | | 2007/0108429 A1 | 5/2007 | Lung |
| 7,505,330 B2 | 3/2009 | Pawlowski et al. | | 2007/0108430 A1 | 5/2007 | Lung |
| 7,507,986 B2 | 3/2009 | Lung | | 2007/0108431 A1 | 5/2007 | Chen et al. |
| 7,514,334 B2 | 4/2009 | Chen et al. | | 2007/0109836 A1 | 5/2007 | Lung |
| 7,515,461 B2 | 4/2009 | Happ et al. | | 2007/0109843 A1 | 5/2007 | Lung et al. |
| 7,577,024 B2 * | 8/2009 | Fackenthal et al. ............ 365/163 | | 2007/0111429 A1 | 5/2007 | Lung |
| 7,606,059 B2 * | 10/2009 | Toda ............................ 365/148 | | 2007/0115794 A1 | 5/2007 | Lung |
| 7,869,270 B2 * | 1/2011 | Lee .............................. 365/163 | | 2007/0117315 A1 | 5/2007 | Lai et al. |
| 2002/0070457 A1 | 6/2002 | Sun et al. | | 2007/0120104 A1 | 5/2007 | Ahn et al. |
| 2002/0113273 A1 | 8/2002 | Hwang et al. | | 2007/0121363 A1 | 5/2007 | Lung |
| 2003/0072195 A1 | 4/2003 | Mikolajick | | 2007/0121374 A1 | 5/2007 | Lung et al. |
| 2003/0095426 A1 | 5/2003 | Hush et al. | | 2007/0126040 A1 | 6/2007 | Lung |
| 2003/0186481 A1 | 10/2003 | Lung | | 2007/0131922 A1 | 6/2007 | Lung |
| 2004/0026686 A1 | 2/2004 | Lung | | 2007/0138458 A1 | 6/2007 | Lung |
| 2004/0051094 A1 | 3/2004 | Ooishi | | 2007/0140029 A1 | 6/2007 | Kim et al. |
| 2004/0113137 A1 | 6/2004 | Lowrey | | 2007/0147105 A1 | 6/2007 | Lung et al. |
| 2004/0165422 A1 | 8/2004 | Hideki et al. | | 2007/0153563 A1 | 7/2007 | Nirschl |
| 2004/0248339 A1 | 12/2004 | Lung | | 2007/0154847 A1 | 7/2007 | Chen et al. |
| 2004/0256610 A1 | 12/2004 | Lung | | 2007/0155172 A1 | 7/2007 | Lai et al. |
| 2004/0264234 A1 | 12/2004 | Moore et al. | | 2007/0156949 A1 | 7/2007 | Rudelic et al. |
| 2005/0018526 A1 | 1/2005 | Lee | | 2007/0158632 A1 | 7/2007 | Ho |
| 2005/0029502 A1 | 2/2005 | Hudgens | | 2007/0158633 A1 | 7/2007 | Lai et al. |
| 2005/0052904 A1 | 3/2005 | Cho et al. | | 2007/0158645 A1 | 7/2007 | Lung |
| 2005/0062087 A1 | 3/2005 | Chen et al. | | 2007/0158690 A1 | 7/2007 | Ho et al. |
| 2005/0093022 A1 | 5/2005 | Lung | | 2007/0158862 A1 | 7/2007 | Lung |
| 2005/0127349 A1 | 6/2005 | Horak et al. | | 2007/0161186 A1 | 7/2007 | Ho |
| 2005/0145984 A1 | 7/2005 | Chen et al. | | 2007/0170881 A1 | 7/2007 | Noh et al. |
| 2005/0167656 A1 | 8/2005 | Sun et al. | | 2007/0173019 A1 | 7/2007 | Ho et al. |
| 2005/0191804 A1 | 9/2005 | Lai et al. | | 2007/0173063 A1 | 7/2007 | Lung |
| 2005/0201182 A1 | 9/2005 | Osada et al. | | 2007/0176261 A1 | 8/2007 | Lung |
| 2005/0212024 A1 | 9/2005 | Happ | | 2007/0187664 A1 | 8/2007 | Happ |
| 2005/0212026 A1 | 9/2005 | Chung et al. | | 2007/0201267 A1 | 8/2007 | Happ et al. |
| 2005/0215009 A1 | 9/2005 | Cho | | 2007/0215852 A1 | 9/2007 | Lung |
| 2005/0263829 A1 | 12/2005 | Song et al. | | 2007/0224726 A1 | 9/2007 | Chen et al. |
| 2006/0006472 A1 | 1/2006 | Jiang | | 2007/0235811 A1 | 10/2007 | Furukawa et al. |
| 2006/0034112 A1 | 2/2006 | Oh et al. | | 2007/0236989 A1 | 10/2007 | Lung |
| 2006/0038221 A1 | 2/2006 | Lee et al. | | 2007/0246699 A1 | 10/2007 | Lung |
| 2006/0066156 A1 | 3/2006 | Dong et al. | | 2007/0249090 A1 | 10/2007 | Philipp et al. |
| 2006/0073642 A1 | 4/2006 | Yeh et al. | | 2007/0257300 A1 | 11/2007 | Ho et al. |
| 2006/0091476 A1 | 5/2006 | Pinnow et al. | | 2007/0262388 A1 | 11/2007 | Ho et al. |
| 2006/0094154 A1 | 5/2006 | Lung | | 2007/0267618 A1 | 11/2007 | Zaidi et al. |
| 2006/0108667 A1 | 5/2006 | Lung | | 2007/0274121 A1 | 11/2007 | Lung et al. |
| 2006/0110878 A1 | 5/2006 | Lung et al. | | 2007/0285960 A1 | 12/2007 | Lung et al. |
| 2006/0110888 A1 | 5/2006 | Cho et al. | | 2007/0298535 A1 | 12/2007 | Lung |
| 2006/0113520 A1 | 6/2006 | Yamamoto et al. | | 2008/0006811 A1 | 1/2008 | Philipp et al. |
| 2006/0113521 A1 | 6/2006 | Lung | | 2008/0012000 A1 | 1/2008 | Harshfield |

| | | | |
|---|---|---|---|
| 2008/0014676 A1 | 1/2008 | Lung et al. | |
| 2008/0025089 A1 | 1/2008 | Scheuerlein et al. | |
| 2008/0043520 A1 | 2/2008 | Chen | |
| 2008/0094871 A1 | 4/2008 | Parkinson | |
| 2008/0101110 A1 | 5/2008 | Happ et al. | |
| 2008/0137400 A1 | 6/2008 | Chen et al. | |
| 2008/0164453 A1 | 7/2008 | Breitwisch et al. | |
| 2008/0165569 A1 | 7/2008 | Chen et al. | |
| 2008/0165570 A1 | 7/2008 | Happ et al. | |
| 2008/0165572 A1 | 7/2008 | Lung | |
| 2008/0166875 A1 | 7/2008 | Lung | |
| 2008/0179582 A1 | 7/2008 | Burr et al. | |
| 2008/0180990 A1 | 7/2008 | Lung | |
| 2008/0186755 A1 | 8/2008 | Lung et al. | |
| 2008/0191187 A1 | 8/2008 | Lung et al. | |
| 2008/0192534 A1 | 8/2008 | Lung | |
| 2008/0197334 A1 | 8/2008 | Lung | |
| 2008/0224119 A1 | 9/2008 | Burr et al. | |
| 2008/0225489 A1 | 9/2008 | Cai et al. | |
| 2008/0265234 A1 | 10/2008 | Lung et al. | |
| 2009/0001341 A1 | 1/2009 | Breitwisch et al. | |
| 2009/0014704 A1 | 1/2009 | Chen et al. | |
| 2009/0023242 A1 | 1/2009 | Lung | |
| 2009/0027950 A1 | 1/2009 | Lam et al. | |
| 2009/0042335 A1 | 2/2009 | Lung | |
| 2009/0057641 A1 | 3/2009 | Lung | |
| 2009/0273968 A1 | 11/2009 | Lamorey et al. | |

FOREIGN PATENT DOCUMENTS

| | | | |
|---|---|---|---|
| WO | 0145108 A1 | 6/2001 | |
| WO | 0225733 A2 | 3/2002 | |

OTHER PUBLICATIONS

"New Memories Tap Spin, Gird for Battle," Science News, Apr. 3, 1999, p. 223, vol. 155.
"Optimized Thermal Capacitance in a Phase Change Memory Cell Design," IPCOM000141986D, IP.com Prior Art Database, Oct. 18, 2006, 4pp.
"Remembering on the Cheap," www.sciencenews.org, Mar. 19, 2005, p. 189, vol. 167.
"Thermal Conductivity of Crystalline Dielectrics" in CRC Handbook of Chemistry and Physics, Internet Version 2007, (87th edition), David R. Lide, ed. Taylor and Francis, Boca Raton, Fl, 2pp.
Adler, D. et al., "Threshold Switching in Chalcogenide-Glass Thin Films," J. Appl/Phys 51(6), Jun. 1980, pp. 3289-3309.
Adler, David, "Amorphous-Semiconductor Devices," Sci. Amer., vol. 236, pp. 36-48, May 1977.
Ahn, S. J. et al., "A Highly Manufacturable High Density Phase Change Memory of 64 Mb and Beyond," IEEE IEDM Dec. 13-15, 2004, pp. 907-910.
Ahn, S. J. et al., "Highly Reliable 5nm Contact Cell Technology for 256Mb PRAM," VLSI Technology, Digest of Technical Papers, Jun. 14-16, 2005, pp. 98-99.
Atwood, G, et al., "90 nm Phase Change Technology with u Trench and Lance Cell Elements," VLSI Technology, Systems and Applications, Apr. 23-25, 2007, pp. 1-2.
Axon Technologies Corporation paper: Technology Description, published in 1997, pp. 1-6.
Bedeschi, F. et al., "4-MB MOSFET-Selected Phase-Change Memory Experimental Chip," IEEE, Sep. 21 to 23, 2004, 4 PP.
Blake thesis, "Investigation of GeTeSb5 Chalcogenide Films for Use as an Analog Memory," AFIT/GE/ENG/00M-04, Mar. 2000, 121 pages.
Chao, Der-Sheng, et al., "Low Programming Current Phase Change Memory Cell with Double GST Thermally Confined Structure," Int'l Symp on VLSI Technology, Systems and Applications, Apr. 23-25, 2007, pp. 1-2.
Chen, An et al., "Non-Volatile Resistive Switching for Advanced Memory Applications," IEEE IEDM, Dec. 5-7, 2005, 4 pp.
Cho, S. L. et al., "Highly Scalable On-axis Confined Cell Structure for High Density PRAM beyond 256Mb," Jun. 14-16, 2005 Symposium on VLSI Technology Digest of Technical Papers, pp. 96-97.
Gibson, G. A. et al., "Phase-change Recording Medium that Enables Ultrahigh-density Electron-beam Data Storage," Applied Physics Letter, 2005, 3 pp., vol. 86.
Gill, Manzur et al., "A High-Performance Nonvolatile Memory Technology for Stand-Alone Memory and Embedded Applications," 2002 IEEE-ISSCC Technical Digest (TD 12.4), 7 pp.
Gleixner, "Phase Change Memory Reliability", 22nd NVSMW, Aug. 26, 2007, 46 pages.
Ha, Y. H. et al., "An Edge Contact Type Cell for Phase Change RAM Featuring Very Low Power Consumption," Jun. 10-12, 2003 Symposium on VLSI Technology Digest of Technical Papers, pp. 175-176.
Happ, T. D. et al., "Novel None-Mask Self-Heating Pillar Phase Change Memory," 2006 Symposium on VLSI Technology, 2 pp.
Haring Bolivar, P. et al., "Lateral Design for Phase Change Random Access Memory Cells with Low-Current Consumption," presented at 3rd E*PCOS 04 Symposium in Balzers, Principality of Liechtenstein, Sep. 4-7, 2004, 4pp.
Horii, H. et al., "A Novel Cell Technology Using N-doped GeSbTe Films for Phase Change RAM," Jun. 10-12, 2003 Symposium on VLSI Technology Digest of Technical Papers, pp. 177-178.
Hudgens, S. et al., "Overview of Phase-Change Chalcogenide Nonvolatile Memory Technology," MRS Bulletin, Nov. 2004, pp. 829-832.
Hwang, Y. N. et al., "Full Integration and Reliability Evaluation of Phase-change RAM Based on 0.24um-CMOS Technologies," Jun. 10-12, 2003 Symposium on VLSI Technology Digest of Technical Papers, pp. 173-174.
Iwasaki, Hiroko et al., "Completely Erasable Phase Change Optical Disk," Jpn. J. Appl. Phys., Feb. 1992, pp. 461-465, vol. 31.
Jeong, C. W. et al., "Switching Current Scaling and Reliability Evaluation in PRAM," IEEE Non-Volatile Semiconductor Memory Workshop, Monterey, CA 2004, pp. 28-29 and workshop cover sheet.
Kim, Kinam et al., "Reliability Investigations for Manufacturable High Density PRAM," IEEE 43rd Annual International Reliability Physics Symposium, San Jose, Apr. 17-21, 2005, pp. 157-162.
Kojima, Rie et al., "Ge-Sn-Sb-Te Phase-change Recording Material Having High Crystallization Speed," Proceedings of PCOS 2000, pp. 36-41.
Lacita, A. L., "Electrothermal and Phase-change Dynamics in Chalcogenide-based Memories," IEEE IEDM Dec. 13-15, 2004, 4 pp.
Lai, Stefan, "Current Status of the Phase Change Memory and Its Future," IEEE IEDM Dec. 10, 2003, pp. 255-258.
Lai, Stephan et al., "OUM-A 180 nm Nonvolatile Memory Cell Element Technology for Stand Alone and Embedded Applications," IEEE IEDM Dec. 2-5, 2001, pp. 803-806.
Lankhorst, Martijn H.R., et al; Low-Cost and Nanoscale Non-Volatile Memory Concept for Future Silicon Chips, Mar. 13, 2005, 6 pp., Nature Materials Advance Online Publication, www.nature.com/naturematerials.
Mott, Nevill, "Electrons in Glass," Nobel Lecture, Dec. 8, 1977, Physics, 1977, pp. 403-413.
Ovonyx Non-Confidential paper entitled "Ovonic Unified Memory," Dec. 1999, pp. 1-80.
Ovshinsky, Sandford R., "Reversible Electrical Switching Phenomena in Disordered Structures," Physical Review Letters, vol. 21, No. 20, Nov. 11, 1968, pp. 1450-1453.
Owen, Alan E. et al., "Electronic Conduction and Switching in Chalcogenide Glasses," IEEE Transactions on Electron Devices, vol. Ed. 20, No. 2, Feb. 1973, pp. 105-122.
Pellizer, F. et al.,"Novel u Trench Phase—Change Memory Cell for Embedded and Stand-Alone Non-Volatile Memory Applications," Jun. 15-17, 2004 Symposium on VLSI Technology Digest of Technical Papers, pp. 18-19.
Pirovano, Agostino et al.,"Reliability Study of Phase-Change Nonvolatile Memories," IEEE Transactions on Device and Materials Reliability, Sep. 2004, pp. 422-427, vol. 4, No. 3.
Prakash, S. et al., "A guideline for Designing Chalcogenide-Based Glasses for Threshold Switching Characteristics," IEEE Electron Device Letters, vol. 18, No. 2, Feb. 1997, pp. 45-47.
Radaelli, A. et al., "Electronic Switching Effect and Phase-Change Transition in Chalcogenide Materials," IEEE Electron Device Letters, Oct. 2004, pp. 684-686, vol. 25, No. 10.
Rochefort, C. et al., "Manufacturing of High Aspect-Ration p-n Junctions Using Vapor Phase Doping for Application in Multi-Resurf Devices," IEEE Jun. 4-7, 2002, pp. 237-240.

Schafft, Harry A. et al., "Thermal Conductivity Measurements of Thin Films Silicon Dioxide," Proceedings of the IEEE 1989 International Conference on Microelectronic Test Structures vol. 2, No. 1, Mar. 1989, pp. 121-124.

Strauss, Karl F. et al., "Overview of Radiation Tolerant Unlimited Write Cycle Non-Volatile Memory," IEEE Mar. 18-25, 2000, pp. 399-408.

Subramanian, Vivek et al., "Low Leakage Germanium-Seeded Laterally-Crystallized Single-Grain 100-nm TFT's for Vertical Integration Applications," IEEE Electron Device Letters, vol. 20, No. 7, Jul. 1999, pp. 341-343.

Wicker, Guy et al., Nonvolatile, High Density, High Performance Phase Change Memory, 1999, http://klabs.org/richcontent/MAPLDCon99/Papers/P21_Tyson_P.PDF#search='nonvolatile%20high%20density%20high%20performance%20phase%20change%20memory', 8pages.

Wicker, Guy, "A Comprehensive Model of Submicron Chalcogenide Switching Devices," Doctoral Dissertation, Wayne State University, Detroit, MI 1996, 137 pp.

Wolf, Stanley, Excerpt from: Silicon Processing for the VLSI Era-vol. 4, pp. 674-679, 2004.

Wuttig, Matthias, "Towards a Universal Memory?" Nature Materials, Apr. 2005, pp. 265-266, vol. 4.

Yamada, Noboru, "Potential of Ge-Sb-Te phase-change optical disks for high-data-rate recording in the near future," (Conference Proceedings Paper), Jul. 30, 1997, vol. 3109, 10 pages.

Yi, J. H. et al., "Novel Cell Structure of PRAM with Thin Metal Layer Inserted GeSbTe," IEEE IEDM Dec. 10, 2003, 4 pages.

Yonehara, T. et al., "Control of Grain Boundary Location by Selective Nucleation Over Amorphous Substrates," Mat. Res. Soc. Symp. Proc., vol. 106, 1998, pp. 21-26.

\* cited by examiner

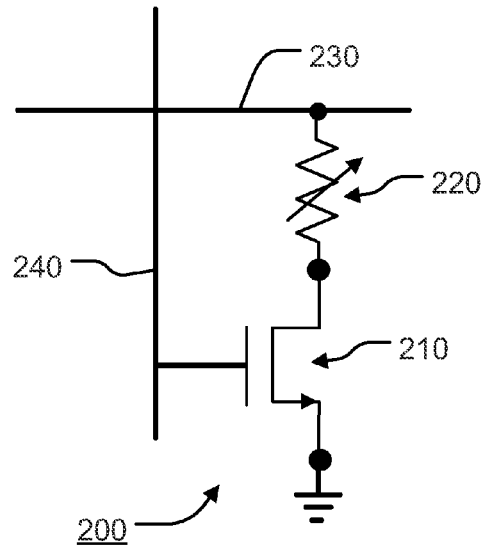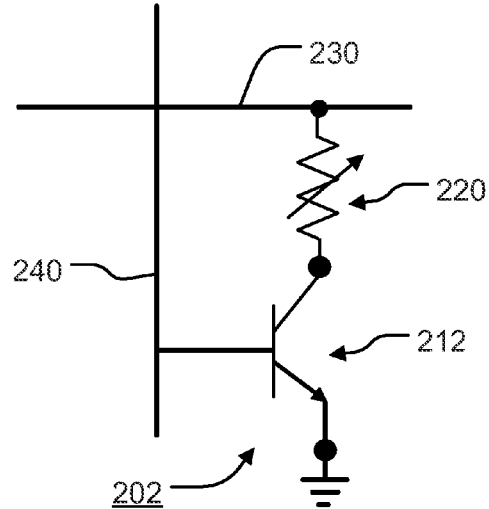
Fig. 2A (Prior Art)
Fig. 2B (Prior Art)
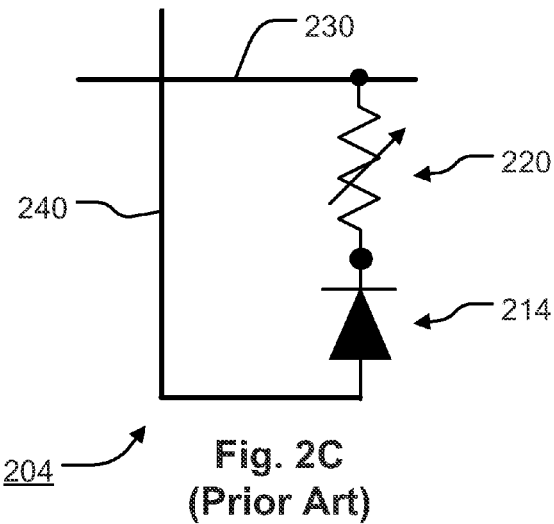
Fig. 2C (Prior Art)

SET ALGORITHM FOR PHASE CHANGE MEMORY CELL

RELATED APPLICATIONS

This application is a continuation of co-pending U.S. patent application Ser. No. 12/345,384 filed on 29 Dec. 2008 which application is incorporated herein by reference.

PARTIES TO A JOINT RESEARCH AGREEMENT

International Business Machines Corporation, a New York corporation, Macronix International Corporation, Ltd., a Taiwan corporation, and Infineon Technologies A.G., a German corporation, are parties to a Joint Research Agreement.

BACKGROUND OF THE INVENTION

1. Field of the Invention

The present invention relates to memory devices based on phase change based memory materials, including chalcogenide based materials and on other programmable resistive materials, and methods for operating such devices.

2. Description of Related Art

Phase change based memory materials, like chalcogenide based materials and similar materials, can be caused to change phase between an amorphous state and a crystalline state by application of electrical current at levels suitable for implementation in integrated circuits. The generally amorphous state is characterized by higher electrical resistivity than the generally crystalline state, which can be readily sensed to indicate data. These properties have generated interest in using programmable resistive material to form nonvolatile memory circuits, which can be read and written with random access.

In phase change memory, data is stored by causing transitions in an active region of the phase change material between amorphous and crystalline states. FIG. 1 is a graph of memory cells comprising phase change material and programmable to a plurality of resistance states including a high resistance reset (erased) state 102 and at least one lower resistance programmed (set) state 100, each state having non-overlapping resistance ranges.

The difference between the highest resistance $R_1$ of the lower resistance state 100 and the lowest resistance $R_2$ of the high resistance reset state 102 defines a read margin 101 used to distinguish cells in the lower resistance state 100 from those in the high resistance state 102. The data stored in a memory cell can be determined by determining whether the memory cell has a resistance corresponding to the lower resistance state 100 or to the high resistance state 102, for example by measuring whether the resistance of the memory cell is above or below a threshold resistance value $R_{SA}$ 103 within the read margin 101.

The change from the high resistance state 102 to the lower resistance state 100, referred to as set (or program) herein, is generally a lower current operation in which current heats the phase change material above a transition temperature to cause transition from the amorphous to the crystalline state. The change from lower resistance state 100 to the high resistance state 102, referred to as reset herein, is generally a higher current operation, which includes a short high current density pulse to melt or breakdown the crystalline structure, after which the phase change material cools quickly, quenching the phase change process and allowing at least a portion of the phase change material to stabilize in the amorphous state.

In order to reliably distinguish between the high resistance state 102 and the lower resistance state 100, it is important to maintain a relatively large read margin 101. However, since the active region undergoes a phase change as a result of heating, during operation issues such as compositional changes in the phase change material within the active region can result in the formation of a high resistance interface within the electrical conduction path of the memory cell. This high resistance interface can result in a "set failure mode" in which the lower current set operation cannot successfully reduce the resistance of the memory cell below the threshold resistance value $R_{SA}$, resulting in reliability issues and bit errors for those memory cells.

It is therefore desirable to provide a memory device and methods for operating such devices addressing the set failure mode and resulting in improved reliability and improved data storage performance.

SUMMARY OF THE INVENTION

A method is described herein for operating a memory cell comprising phase change material and programmable to a plurality of resistance states including a high resistance state and at least one lower resistance state. The method comprises applying a first bias arrangement to the memory cell to establish the lower resistance state, the first bias arrangement comprising a first voltage pulse. The method further comprises determining whether the memory cell is in the lower resistance state, and if the memory cell is not in the lower resistance state then applying a second bias arrangement to the memory cell to establish the lower resistance state. The second bias arrangement comprises a second voltage pulse having a pulse height greater than that of the first voltage pulse.

A memory device as described herein comprises a memory cell comprising phase change material and programmable to a plurality of resistance states including a high resistance state and a lower resistance state. The memory device further comprises bias circuitry adapted to apply bias arrangements to the memory cell. The bias arrangements include a first bias arrangement to establish the lower resistance state, the first bias arrangement comprising a first voltage pulse. The bias arrangements also include a read bias arrangement to determine whether the memory cell is in the lower resistance state after the set bias arrangement. The bias arrangements further include a second bias arrangement to establish the lower resistance state, the second bias arrangement comprising a second voltage pulse having a pulse height greater than that of the first voltage pulse.

Memory devices and methods for operating such devices described herein address the set failure mode and result in improved endurance, reliability and data storage performance. Set operations described herein comprise applying lower voltages across the phase change material of memory cells to establish the lower resistance state and only applying higher voltages across the phase change material when the lower voltage is insufficient to set the memory cell.

Other aspects and advantages of the present invention can be seen on review of the drawings, the detailed description, and the claims which follow.

BRIEF DESCRIPTION OF THE DRAWINGS

FIGS. 2A-2C illustrate schematic diagrams of three prior art phase change memory cells having a phase change memory element coupled to a select device.

DETAILED DESCRIPTION

Figure 1:
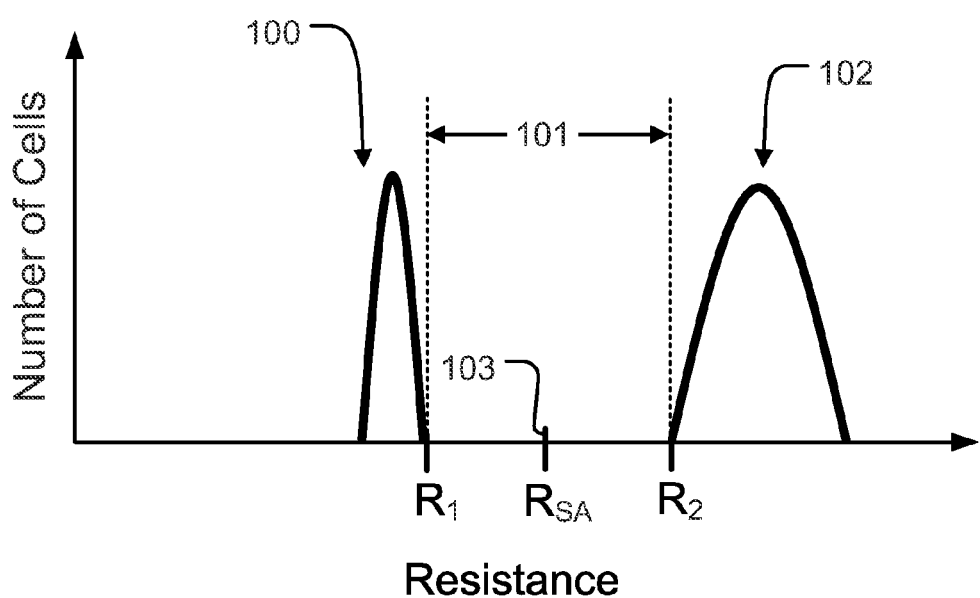
FIG. 1 is a graph of memory cells comprising phase change material and programmable to a plurality of resistance states including a high resistance reset state and at least one lower resistance programmed state.

The following description of the disclosure will typically be with reference to specific structural embodiments and methods. It is to be understood that there is no intention to limit the disclosure to the specifically disclosed embodiments and methods, but that the disclosure may be practiced using other features, elements, methods and embodiments. Preferred embodiments are described to illustrate the present disclosure, not to limit its scope, which is defined by the claims. Those of ordinary skill in the art will recognize a variety of equivalent variations on the description that follows. Like elements in various embodiments are commonly referred to with like reference numerals.

FIGS. 2A-2C illustrate schematic diagrams of three prior art phase change memory cells having a phase change material memory element 220 (represented in the Figures by a variable resistor) and coupled to an access device such as a transistor or diode.

FIG. 2A illustrates a schematic diagram of a prior art memory cell 200 including a field effect transistor (FET) 210 as an access device. A word line 240 extending in a first direction is coupled to the gate of the FET 210 and a memory element 220 couples the drain of the FET 210 to a bit line 230 extending in a second direction.

FIG. 2B illustrates a schematic diagram of memory cell 202 similar to that of FIG. 2A except that the access device is implemented as a bipolar junction transistor (BJT) 212, while FIG. 2C illustrates a schematic diagram of a memory cell 204 similar to that of FIG. 2A except that the access device is implemented as a diode 214.

Reading or writing can be achieved by applying suitable voltages to the word line 240 and bit line 230 to induce a current through the memory element 220. The level and duration of the voltages applied is dependent upon the operation performed, e.g. a reading operation or a writing operation.

FIGS. 3A-3E illustrate cross-sectional views of prior art configurations for memory element 220.

Figure 3A:
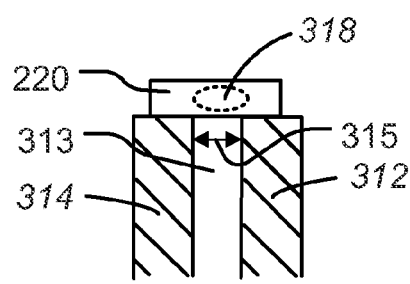
FIGS. 3A-3E illustrate cross-sectional views of prior art configurations of memory elements.

FIG. 3A is a simplified cross-sectional view illustrating a first configuration for memory element 220 coupled to first and second electrodes 312, 314. The first electrode 312 may, for example, be coupled to a terminal of an access device such as a diode or transistor, while the second electrode 314 may be coupled to a bit line.

A dielectric spacer 313 having a width 315 separates the first and second electrodes 312, 314. The phase change material of memory element 220 extends across the dielectric spacer 313 and contacts the first and second electrodes 312, 314, thereby defining an inter-electrode path between the first and second electrodes 312, 314 having a path length defined by the width 315 of the dielectric spacer 313. In operation, as current passes between the first and second electrodes 312, 314 and through the memory element 220, the active region 318 of the phase change material of the memory element 220 heats up more quickly than the remainder of the memory element 220.

Figure 3B:
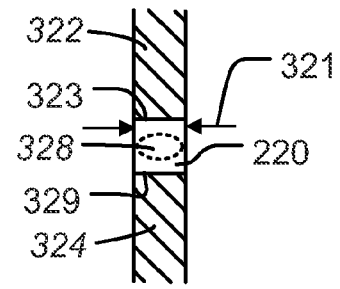

FIG. 3B is a simplified cross-sectional view illustrating a second configuration for memory element 220 coupled to first and second electrodes 322, 324. The phase change material of the memory element 220 has an active region 328 and contacts the first and second electrodes 322, 324 at top and bottom surfaces 323, 329 respectively. The memory element 220 has a width 321 the same as that of the first and second electrodes 322, 324.

Figure 3C:
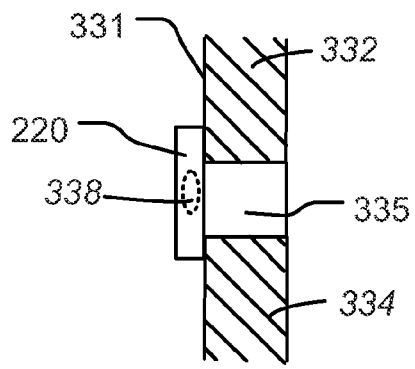

FIG. 3C is a simplified cross-sectional view illustrating a third configuration for memory element 220 coupled to first and second electrodes 332, 334, the phase change material of memory element 220 having an active region 338. The first and second electrodes 332, 334 are separated by dielectric spacer 335. The first and second electrodes 332, 334 and the dielectric spacer 335 have a sidewall surface 331. The phase change material of memory element 220 is on the sidewall surface 331 and extends across the dielectric spacer 335 to contact the first and second electrodes 332, 334.

Figure 3D:
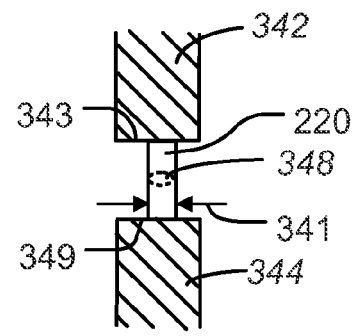

FIG. 3D is a simplified cross-sectional view illustrating a fourth configuration for memory element 220 coupled to first and second electrodes 342, 344. The phase change material of memory element 220 has an active region 348 and contacts the first and second electrodes 342, 344 at top and bottom surfaces 343, 349 respectively. The memory element 220 has a width 341 less than that of the first and second electrodes 342, 344.

Figure 3E:
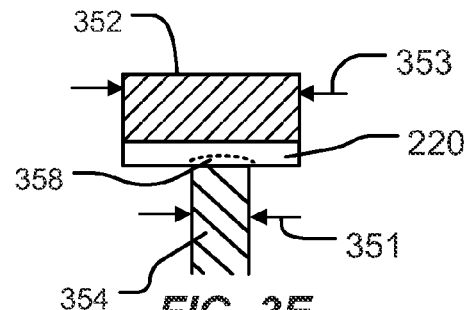

FIG. 3E is a simplified cross-sectional view illustrating a fifth configuration for memory element 220 coupled to first and second electrodes 354, 352. The first electrode 354 has a width 351 less than width 353 of the second electrode 352 and memory element 220. Because of the difference between width 351 and width 353, in operation the current density in the phase change material of memory element 220 is largest in the region adjacent the first electrode 354, resulting in the active region 358 having a "mushroom" shape as shown in the Figure.

As was described above, in operation issues such as compositional changes in the phase change material within the active region can result in formation of a high resistance interface within the conduction path of the memory cell. The high resistance interface can result in a "set failure mode" in which the resistance of the memory cell cannot be reduced to a resistance corresponding to a lower resistance state using a lower voltage set operation, resulting in reliability issues and bit errors for those memory cells.

Figure 4:
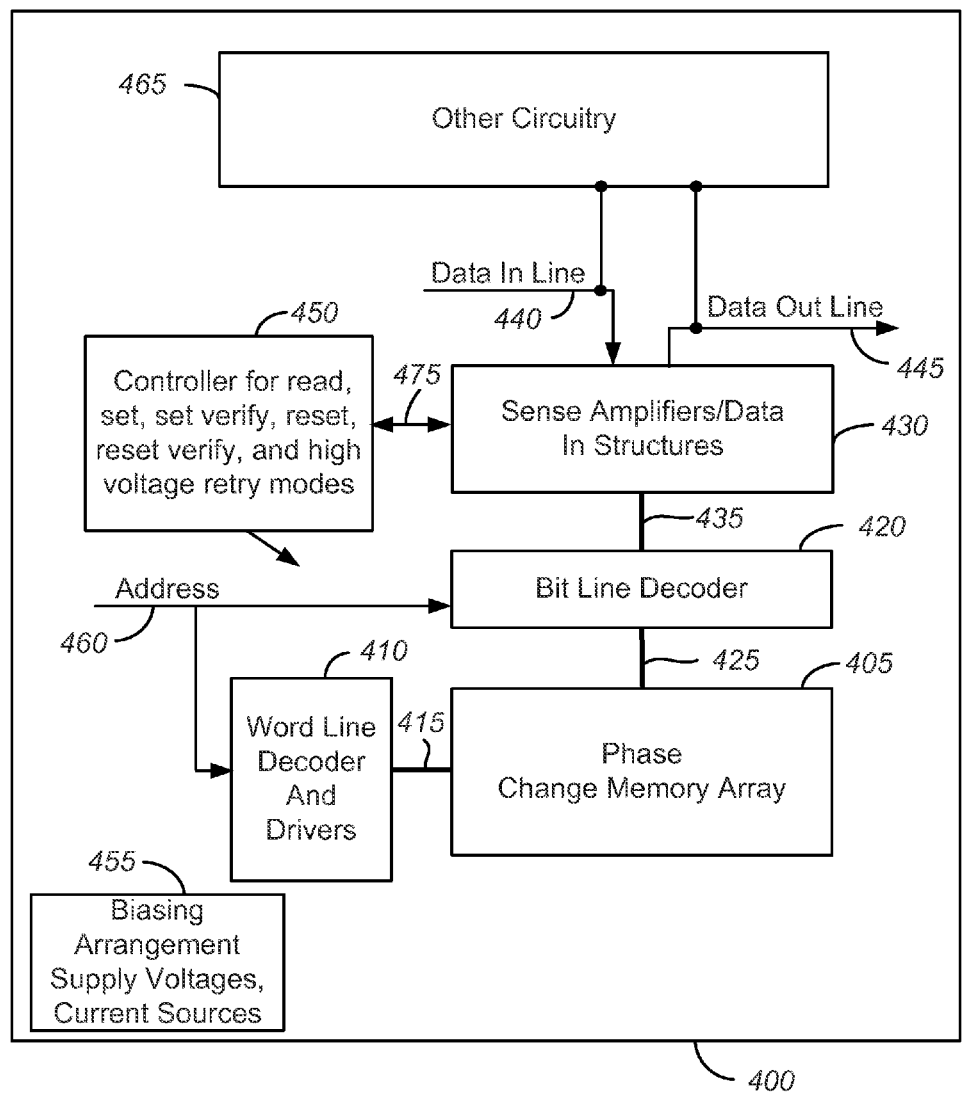
FIG. 4 is a simplified block diagram of an integrated circuit in which the set operations described herein can be implemented.

FIG. 4 is a simplified block diagram of an integrated circuit 400 in which the set operations (described in more detail below) can be implemented, the set operations addressing the set failure mode and resulting in improved reliability and improved data storage performance of the integrated circuit 400. The integrated circuit 400 includes a memory array 405 implemented using phase change memory cells (not shown). A word line decoder and drivers 410 having read, set, reset, reset verify, set verify, and high-voltage retry modes is coupled to and in electrical communication with a plurality of word lines 415 arranged along rows in the memory array 405. A bit line (column) decoder 420 is in electrical communication with a plurality of bit lines 425 arranged along columns in the array 405 for reading, setting, resetting, reset verify, set verify, and high-voltage retry of the phase change memory cells in array 405. Addresses are supplied on bus 460 to word line decoder and drivers 410 and bit line decoder 420. Sense circuitry (Sense amplifiers) and data-in structures in block 430 are coupled to bit line decoder 420 via data bus 435. Data is supplied via a data-in line 440 from input/output ports on integrated circuit 400, or from other data sources internal or external to integrated circuit 400, to data-in structures in block 430. Other circuitry 465 may be included on integrated circuit 400, such as a general purpose processor or special purpose application circuitry, or a combination of modules providing system-on-a-chip functionality supported by array 405. Data is supplied via a data-out line 445 from the sense amplifiers in block 430 to input/output ports on integrated circuit 400, or to other data destinations internal or external to integrated circuit 400.

The integrated circuit 400 includes a controller 450 for read, set, set verify, reset, reset verify, and high voltage retry modes. The controller 450, implemented in this example using a bias arrangement state machine, controls the application of bias arrangement supply voltages and current sources 455 for the application of bias arrangements including read, set, reset, reset verify, set verify, and high-voltage retry. The controller 450 is coupled to the sense amplifiers in block 430 via feedback bus 475, the controller 450 controlling the bias arrangement supply voltages and current sources 455 in response to output signals of the sense amplifiers. Controller 450 may be implemented using special-purpose logic circuitry as known in the art. In alternative embodiments, controller 450 comprises a general-purpose processor, which may be implemented on the same integrated circuit to execute a computer program to control the operations of the device. In yet other embodiments, a combination of special-purpose logic circuitry and a general-purpose processor may be utilized from implementation of controller 450.

Figure 5:
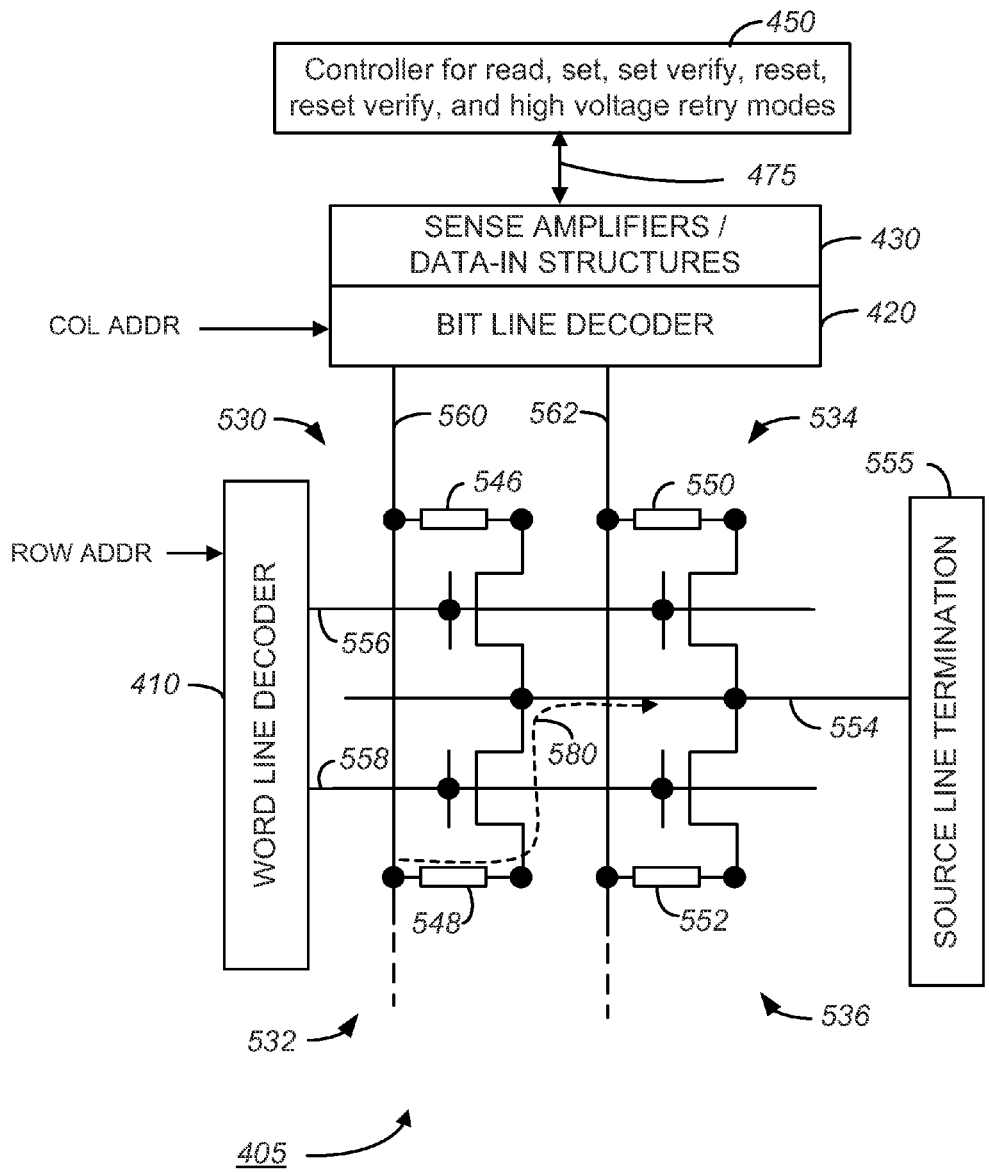
FIG. 5 illustrates a portion of the memory array.

As shown in FIG. 5, each of the memory cells of array 405 includes an access transistor (or other access device such as a diode), four of which are shown as memory cells 530, 532, 534, and 536 having respective phase change memory elements 546, 548, 550, and 552 are illustrated in FIG. 5, representing a small section of an array that can include millions of memory cells. The memory cells are programmable to a plurality of resistance states including a high resistance state and at least one lower resistance state.

Sources of each of the access transistors of memory cells 530, 532, 534, 536 are connected in common to source line 554 that terminates in a source line termination circuit 555, such as a ground terminal. In another embodiment the sources of the access devices are not electrically connected, but independently controllable. The source line termination circuit 555 may include bias circuits such as voltage sources and current sources, and decoding circuits for applying bias arrangements, other than ground, to the source line 554 in some embodiments.

A plurality of word lines 415 including word lines 556, 558 extend in parallel along a first direction. Word lines 556, 558 are in electrical communication with word line decoder 410. The gates of access transistors of memory cells 530, 534 are connected to word line 556, and the gates of access transistors of memory cells 532, 536 are connected to word line 558.

A plurality of bit lines 435 including bit lines 560, 562 extend in parallel in a second direction and are in electrical communication with bit line decoder 420. Memory elements 546, 548 couple the bit line 560 to the respective drains of the access transistors of memory cells 530, 532. Memory elements 550, 552 couple the bit line 562 to the respective drains of the access transistors of memory cells 534, 536.

It will be understood that the memory array 405 is not limited to the array configuration illustrated in FIG. 5, and additional array configurations can also be used. Additionally, instead of MOS transistors, bipolar transistors or diodes may be used as access devices in some embodiments.

In operation each of the memory cells 530, 532, 534, 536 store a data value depending upon the resistance of the corresponding memory elements. The data value may be determined, for example, by comparison of current on a bit line for a selected memory cell to that of a suitable reference current. In a memory cell having three or more states, a plurality of reference currents can be established so that differing ranges of bit line currents correspond to each of the three or more states.

Reading or writing to a memory cell of array 405, therefore, is achieved by applying a suitable voltage to one of word lines 556, 558 and coupling one of bit lines 560, 562 to a voltage so that current flows through the selected memory cell including through the corresponding memory element. For example, a current path 580 through a selected memory cell (in this example memory cell 532 and corresponding memory element 548 are selected) is established by applying voltages to the bit line 560, word line 558, and source line 554 sufficient to turn on the access transistor of memory cell 532 and induce current in path 580 to flow from the bit line 560 to the source line 554, or vice-versa. The level and duration of the voltages applied is dependent upon the operation performed, e.g. a reading operation or a writing operation.

In a reset (or erase) operation of memory cell 532, word line decoder 410 facilitates providing word line 558 with a suitable voltage to turn on the access transistor of the memory cell 532. Bit line decoder 420 facilitates supplying one or more voltage pulses to bit line 560 of suitable amplitude and duration to induce a current to flow though memory element 548, thereby raising the temperature of at least the active region above the transition temperature of the phase change material of the memory element 548 and also above the melting temperature to place at least the active region in a liquid state. The current is then terminated, for example by terminating the voltage pulse on the bit line 560 and the voltage on the word line 558, resulting in a relatively quick quenching time as the active region rapidly cools to stabilize to an amorphous phase. The reset operation can comprise one or more pulses, for example comprising a pair of pulses.

In a read (or sense) operation of memory cell 532, word line decoder 410 facilitates providing word line 558 with a suitable voltage to turn on the access transistor of the memory cell 532. Bit line decoder 420 facilitates supplying a voltage to bit line 560 of suitable amplitude and duration to induce current to flow that does not result in the memory element 448 undergoing a change in resistive state. The current on the bit line 560 and through the memory element 548 is dependent upon the resistance of, and therefore the data state associated with, the memory element 548 of the memory cell 532. Thus, the data state of the memory cell may be determined, for example by comparison of the current on bit line 560 with a suitable reference current by sense amplifiers of sense circuitry 430.

Figure 6:
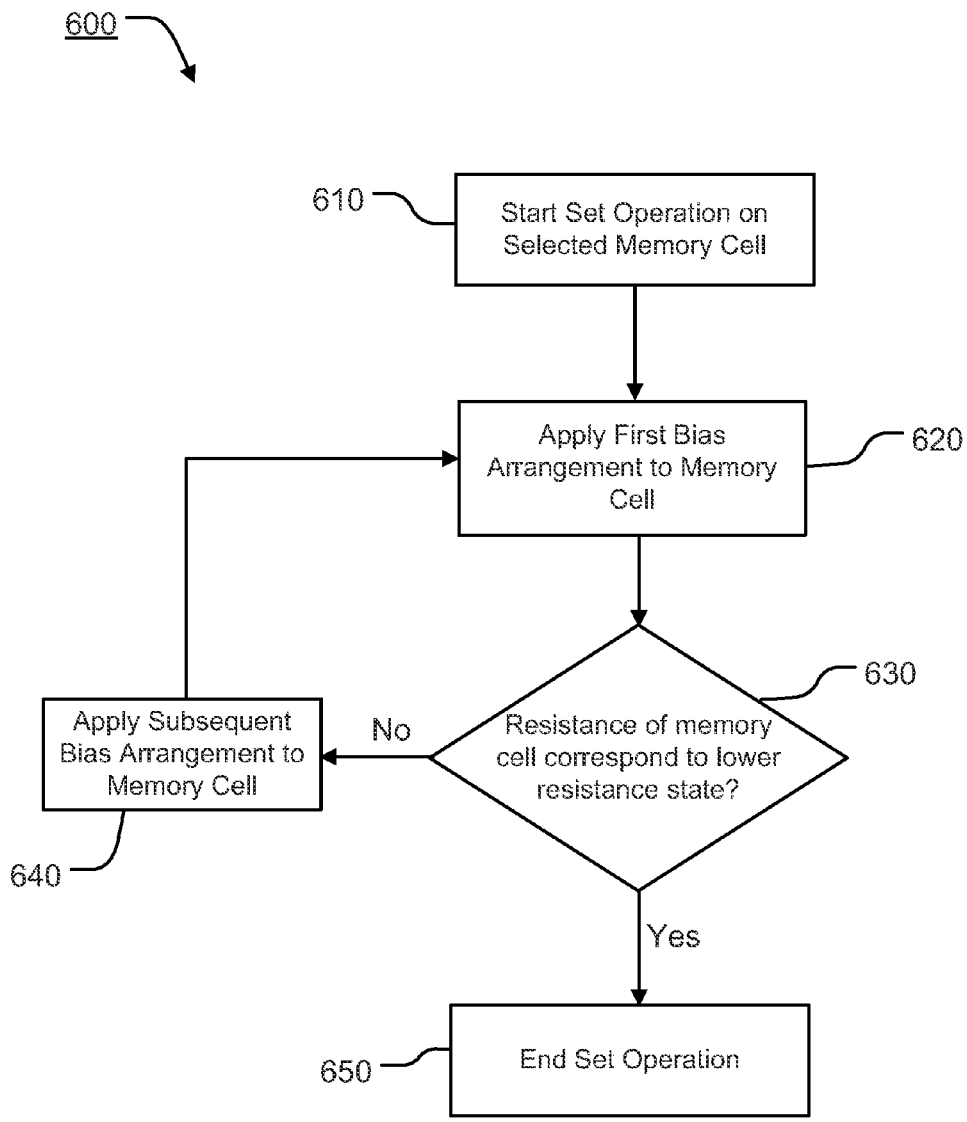
FIG. 6 is a flow diagram of a first embodiment of a set operation for programming a memory cell from a higher resistance state to a lower resistance state.
Figure 7:
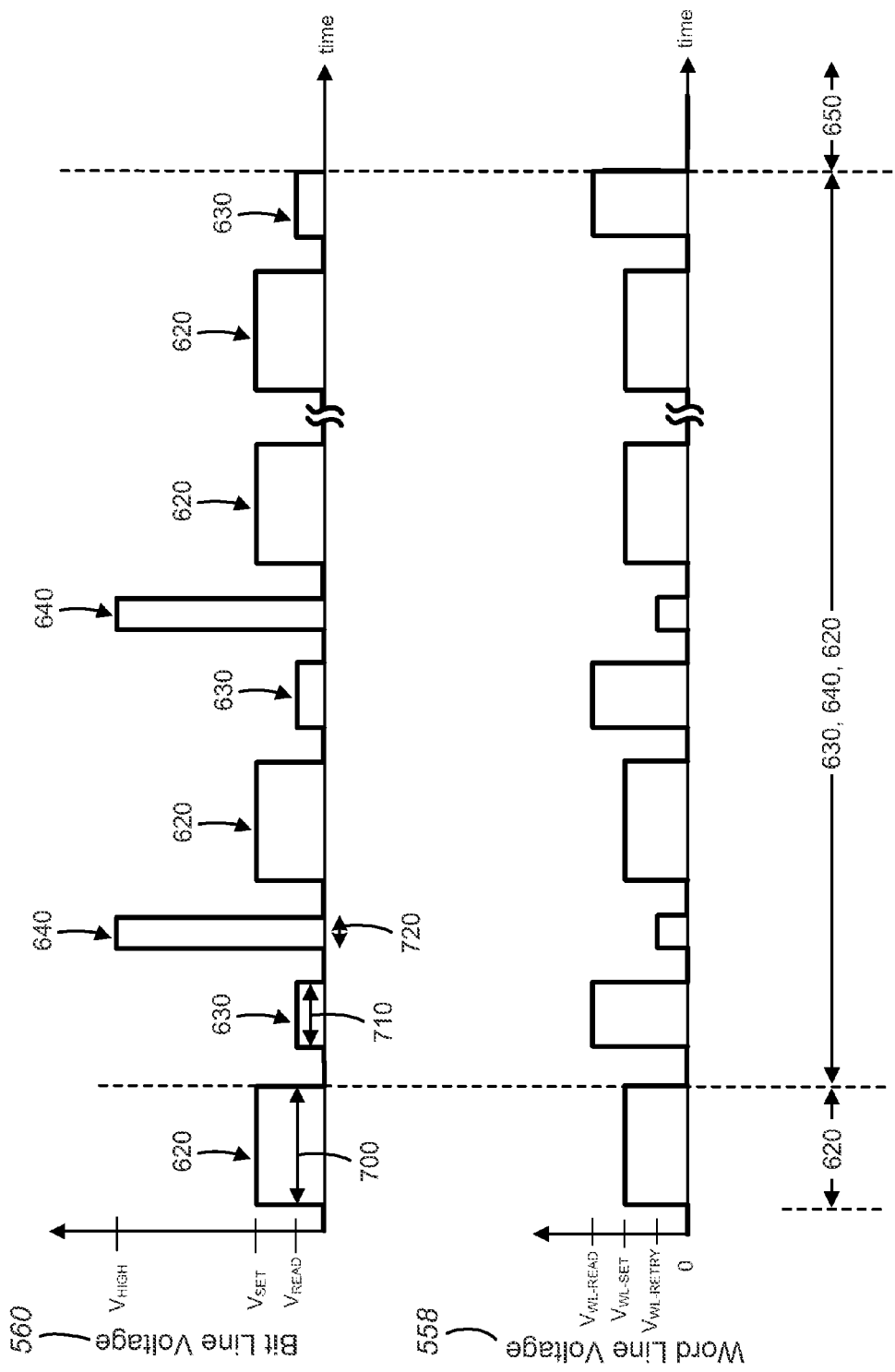
FIG. 7 illustrates an embodiment of a timing diagram of the set operation of FIG. 6.

FIG. 6 is a flow diagram of a first embodiment of a set operation 600 for programming memory cell 532 from a higher resistance state to a lower resistance state. FIG. 7 illustrates an embodiment of a timing diagram of the set operation 600 of FIG. 6. As will be understood the timing diagram of FIG. 7 is simplified and not necessarily to scale.

The set operation 600 for selected memory cell 532 begins at step 610. Step 610 may include, or in some embodiments be preceded by, a read operation to determine if the selected memory cell 532 need to be programmed by the set operation 600. The read operation can be accomplished by applying a read bias arrangement such as supplying voltages to word line 558 and bit line 560 sufficient to turn on the access transistor of the selected memory cell 532 and to induce current to flow in path 580 on the bit line 560 and through the memory element 548 to the source line 554 (which is terminated to ground in this example). The current is insufficient for the memory element 548 to undergo a change in resistive state, and the resistance of the memory cell 532 may be determined by comparison of the current on the bit line 560 to a suitable reference current by sense amplifiers of block 430.

Figure 8:
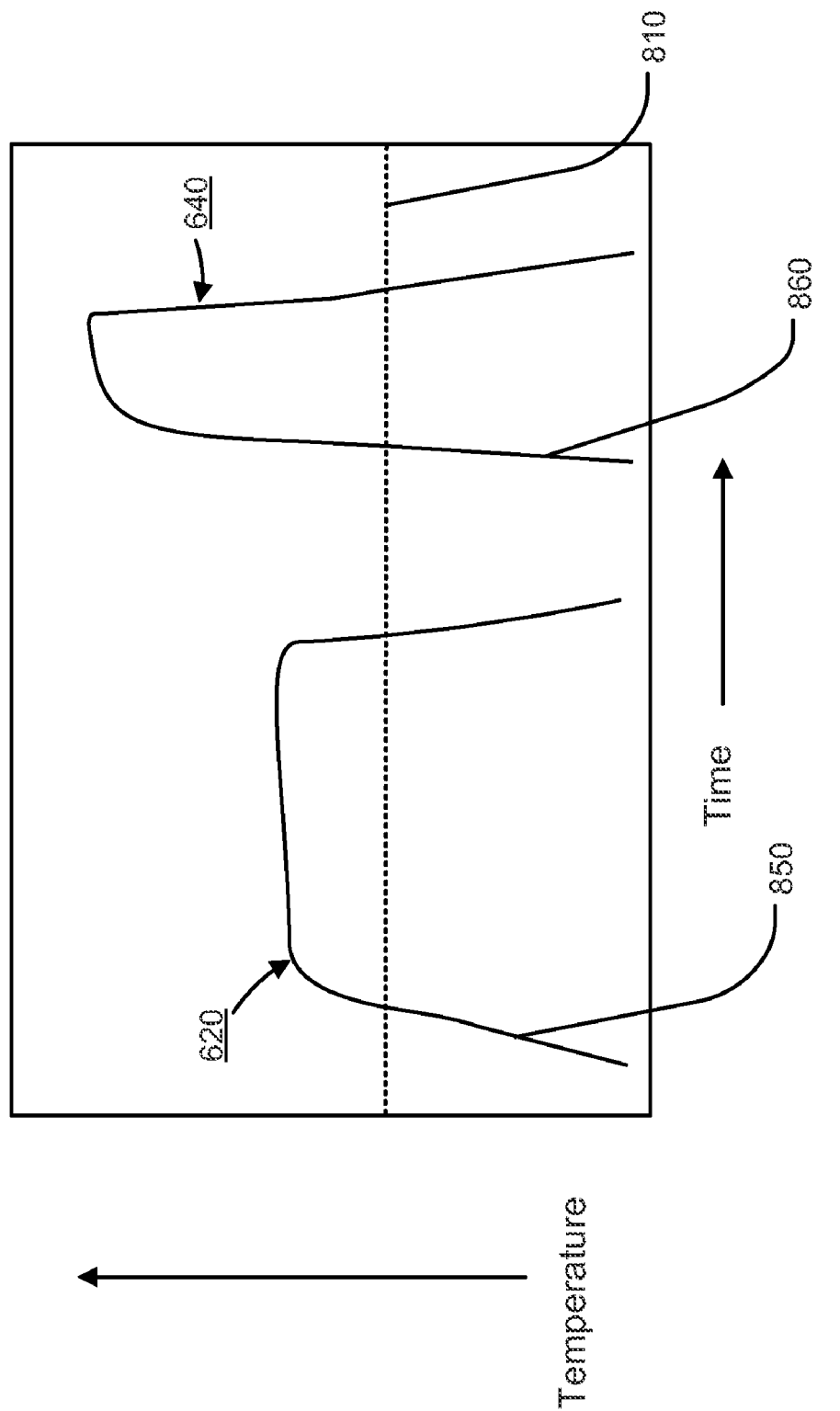
FIG. 8 illustrates heuristic curves of the temperature versus time for portions of the set operation of FIG. 6.

Referring to FIGS. 7 and 8, next at step 620 a first bias arrangement is applied to the memory cell 532 to establish the lower resistance state in the memory cell 532. In the illustrated embodiment the first bias arrangement of step 620 comprises applying a voltage $V_{WL-SET}$ to word line 558 above the threshold voltage $V_{th}$ of the access transistor of the selected memory cell 532, and applying a voltage pulse having a pulse height of $V_{SET}$ and pulse length 700 to the bit line 560 to induce current to flow in path 580 and provide a first amount of energy to the phase change material of memory element 548.

As represented heuristically in curve 850 of FIG. 8, the first amount of energy provided to the phase change material of the memory element 548 is sufficient to raise the temperature of at least a portion of the active region of the memory element above the transition (crystallization) temperature 810 of the phase change material. The first amount of energy causes at least a portion of the active region to transition into a crystalline phase, thereby establishing the lower resistance state. As will be understood, the curve 850 is merely illustrative and the actual shape of the curve 850 depends upon the properties of the memory cell, the manner in which the set bias arrangement is applied to the memory cell, and the manner in which the phase change material heats up and cools down.

Figure 9A:
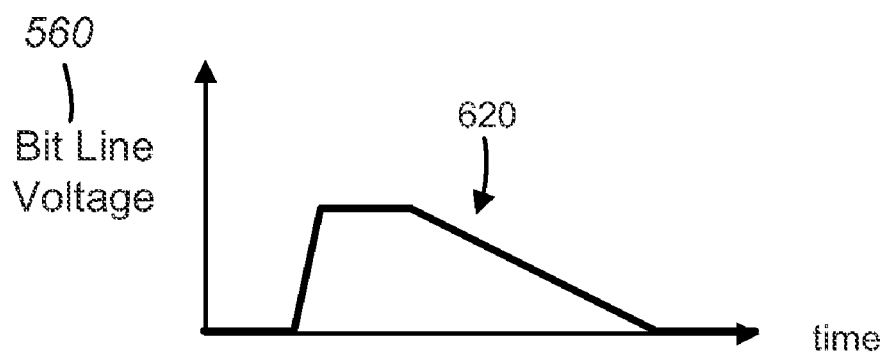
FIGS. 9A-9C illustrate some alternative pulses for the set bias arrangement of the set operation of FIG. 6.
Figure 9B:
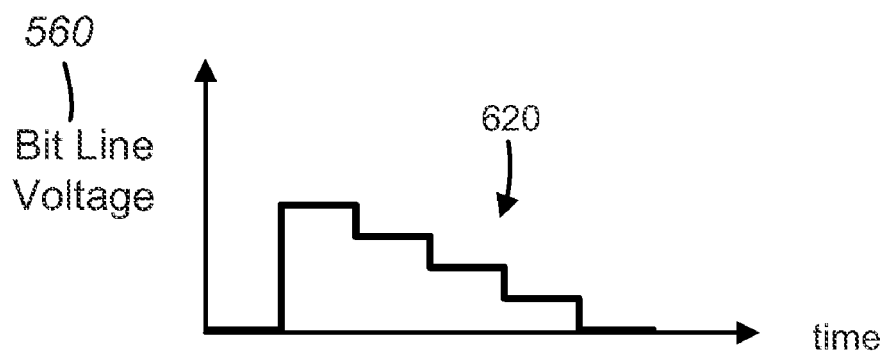
Figure 9C:
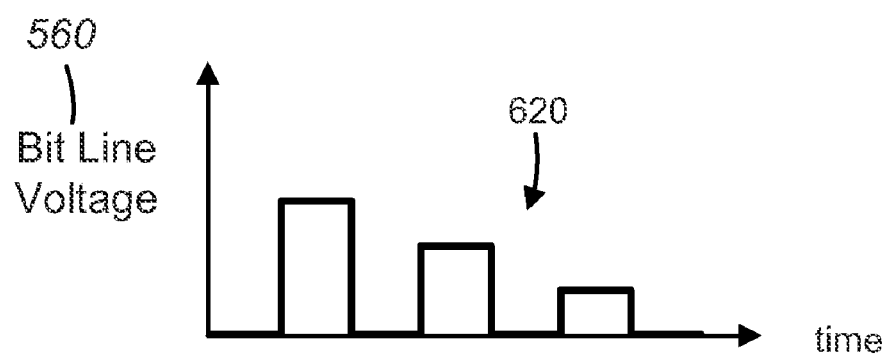

In the illustrated embodiment of FIGS. 6-8, the first bias arrangement of step 620 comprises a single pulse having a pulse height of $V_{SET}$ and pulse width 700 applied to the bit line 560, although it will be understood that other set bias arrangements can alternatively be used. More generally, a set of one or more pulses may be applied to the bit line 560 and/or word line 558 and/or source line 554 to induce current flow in path 580 to provide the first amount of energy to the phase change material of memory element 548. The number of pulses and the pulse shapes, including the voltage levels and pulse widths, of the first bias arrangement can be determined empirically for each embodiment. FIGS. 9A-9C illustrate some examples of the pulses of the set bias arrangement of step 620 that may be used in some alternative embodiments.

Referring back to FIG. 6, the set method 600 continues to step 630. At step 630 the resistance of the selected memory cell is read to determine whether the memory cell 232 has a resistance corresponding to the lower resistance state. The read operation of step 630 applies a read bias arrangement to the memory cell 232. In the illustrated embodiment the read bias arrangement comprises maintaining the voltage $V_{WL-READ}$ on the word line 558 and applying a voltage pulse having a pulse height of $V_{READ}$ and pulse length 710 to the bit line 560 to induce current to flow in path 580, the current insufficient for the memory element 548 to undergo a change in resistive state. Other read bias arrangements may alternatively be used.

For example, the resistance of the memory cell 532 may be determined by comparison of the current on the bit line 560 to a suitable reference current by sense amplifiers of block 430. Based on the comparison, an output signal of the sense amplifiers of block 430 indicating whether the memory cell has a resistance corresponding to the lower resistance state is supplied to the controller 450 via feedback bus 475. In response to the output signal, the controller 450 terminates the set operation at step 650 if the selected memory cell 538 has a resistance corresponding to the lower resistance state. Other techniques for terminating the set operation may alternatively be used.

If the resistance of the memory cell 532 is not in the lower resistance state, the memory cell 532 has experienced a set failure. This failure may come from the formation of a high resistance layer (or interface) within the electrical conduction path of the memory cell. A retry (or second) bias arrangement is then applied to the memory cell to create the conduction path and establish the lower resistance state, the retry bias arrangement comprising a second voltage pulse across the phase change material having a pulse height greater than the pulse height $V_{SET}$ of the set bias arrangement of step 620.

In the illustrated embodiment of FIG. 6, the retry bias arrangement of the set operation 600 begins at step 640 where a subsequent higher bit line voltage bias arrangement is applied to the memory cell.

Referring to FIGS. 7 and 8, in the illustrated embodiment the subsequent bias arrangement of step 640 comprises applying a voltage $V_{WL-RETRY}$ to word line 558, and applying a voltage pulse having a pulse height of $V_{HIGH}$ and pulse length 720 to the bit line 560 to induce current to flow in path 580 and provide energy to the phase change material of memory element 548. As can be seen in FIG. 7, in the illustrated embodiment the pulse of step 640 has a pulse width less than that of the pulse of step 620 and has a pulse height greater than that of the pulse of step 620.

In embodiments the above mentioned $V_{WL-SET}$, $V_{WL-READ}$, $V_{WL-RETRY}$ can be equal or different. For a typical set-up, using a higher $V_{WL-READ}$ will increase the accuracy of the read operation, while a lower $V_{WL-SET}$ and $V_{WL-RETRY}$ will prevent large current flow through the memory device when doing the set and retry operations.

As represented heuristically in curve 860 of FIG. 8, the pulse having a pulse height $V_{HIGH}$ across the phase change material of the memory element 548 is sufficient to breakthrough the high resistive layer and create a conduction path. As will be understood, the curve 860 is merely illustrative and the actual shape of the curve 860 depends upon the properties of the memory cell, the manner in which the subsequent bias arrangement is applied to the memory cell, and the manner in which the phase change material heats up and cools down.

In some embodiments the bias arrangement of step 640 is the same as the reset bias arrangement used for resetting the memory cell and is sufficient to melt the active region and cause a transition to the high resistance state. Additionally, in some embodiments the subsequent bias arrangement may be current limited, for example by using a lower $V_{WL-RETRY}$, which may prevent damage of the memory device under the high bias condition once breakthrough of the high resistance layer occurs. In FIG. 7 $V_{WL-RETRY}$ is less than $V_{WL-SET}$. As a result, in some embodiments the current induced through the phase change material of the memory element during step 640 can be less than the current induced through the phase change material during step 620.

In the illustrated embodiment of FIGS. 6-8, the subsequent bias arrangement of step 640 comprises a single pulse having a pulse height of $V_{HIGH}$ and pulse width 720 applied to the bit line 560, although it will be understood that other subsequent bias arrangements can alternatively be used. More generally, the subsequent bias arrangement of step 640 may comprise a set of one or more pulses applied to the bit line 560 and/or word line 558 and/or source line 554 to induce current flow in path 580. The number of pulses and the pulse shapes, including the voltage levels and pulse width, of the subsequent bias arrangement can be determined empirically for each embodiment.

In the illustrated embodiment of FIGS. 6-8, the word line voltages for the different steps, including steps 630, 630, and 640 can have different values.

Next, the retry (or second) bias arrangement of the set operation 600 continues back to step 620 where the set bias arrangement is applied to the memory 532.

The set operation 600 then continues to step 630 to determine whether the memory cell 232 has a resistance corresponding to the lower resistance state. The set operation continues in the loop of iteratively applying the retry (or second) bias arrangement (steps 640, 620) and determining whether the memory cell 232 has a resistance corresponding to the lower resistance state (step 630) until the resistance of the memory cell 532 corresponds to the lower resistance state, or until a predetermined number of retries are made. In some alternative embodiments the pulses of the retry bias arrangement may be changed for each iteration. If in step 630 it is determined that the memory cell has a resistance corresponding to the lower resistance state, the set operation terminates at step 650.

In the illustrated embodiment of FIG. 6, if the memory cell 532 has experienced a set failure the retry bias arrangement comprises the subsequent bias arrangement of step 640 combined with the first bias arrangement of step 620.

Figure 10:
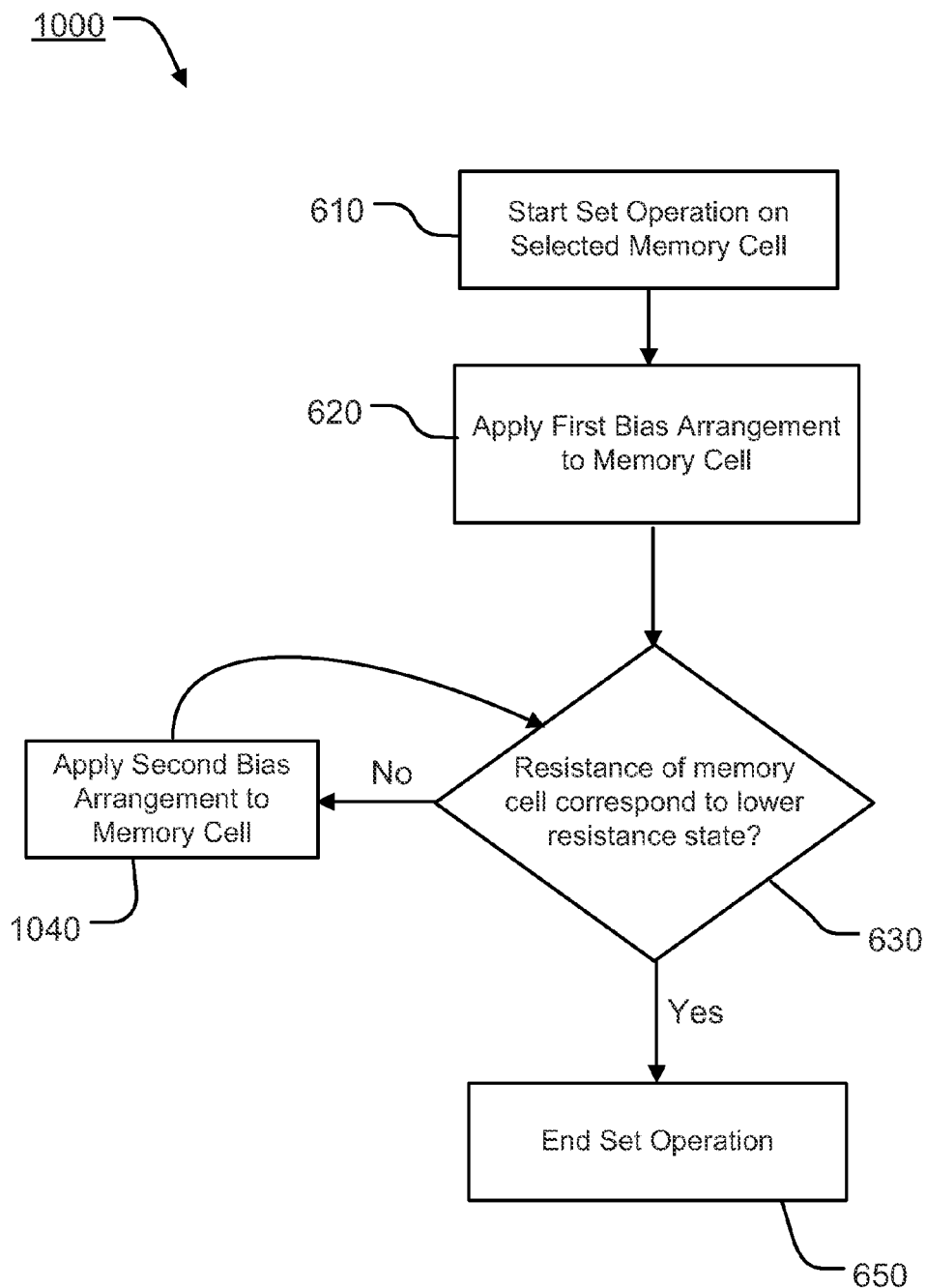
FIG. 10 is a flow diagram of a second embodiment of a set operation for programming a memory cell from a higher resistance state to a lower resistance state
Figure 11:
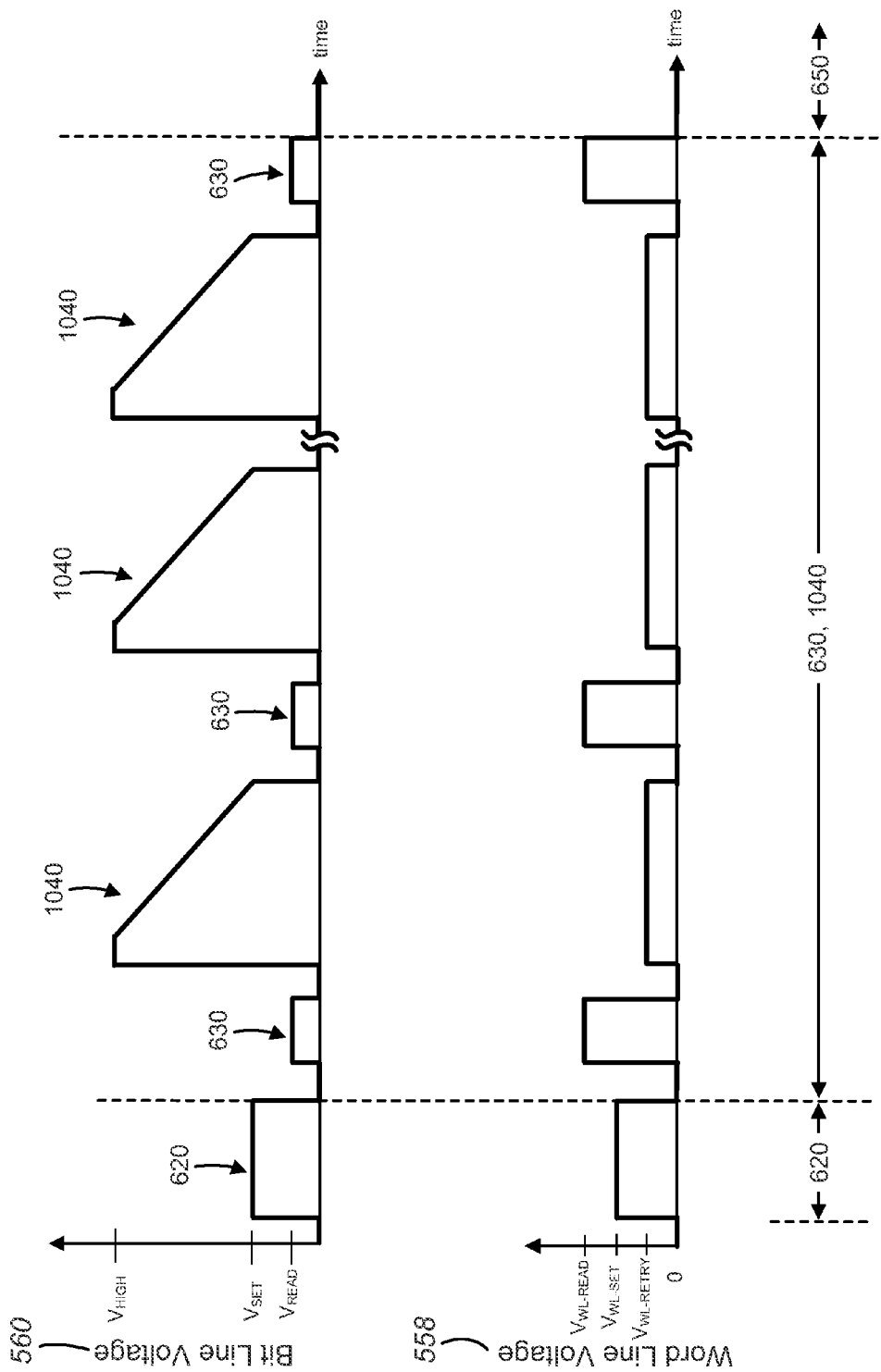
FIG. 11 illustrates an embodiment of a timing diagram of the set operation of FIG. 10.

FIG. 10 illustrates a second embodiment of a set operation 1000 in which the retry (or second) bias arrangement 1040 does not include the first bias arrangement of step 620, and instead includes the function of setting the memory cell 532. FIG. 11 illustrates an embodiment of a timing diagram of the set operation 1000 of FIG. 10. As will be understood the timing diagram of FIG. 11 is simplified and not necessarily to scale.

Figure 12:
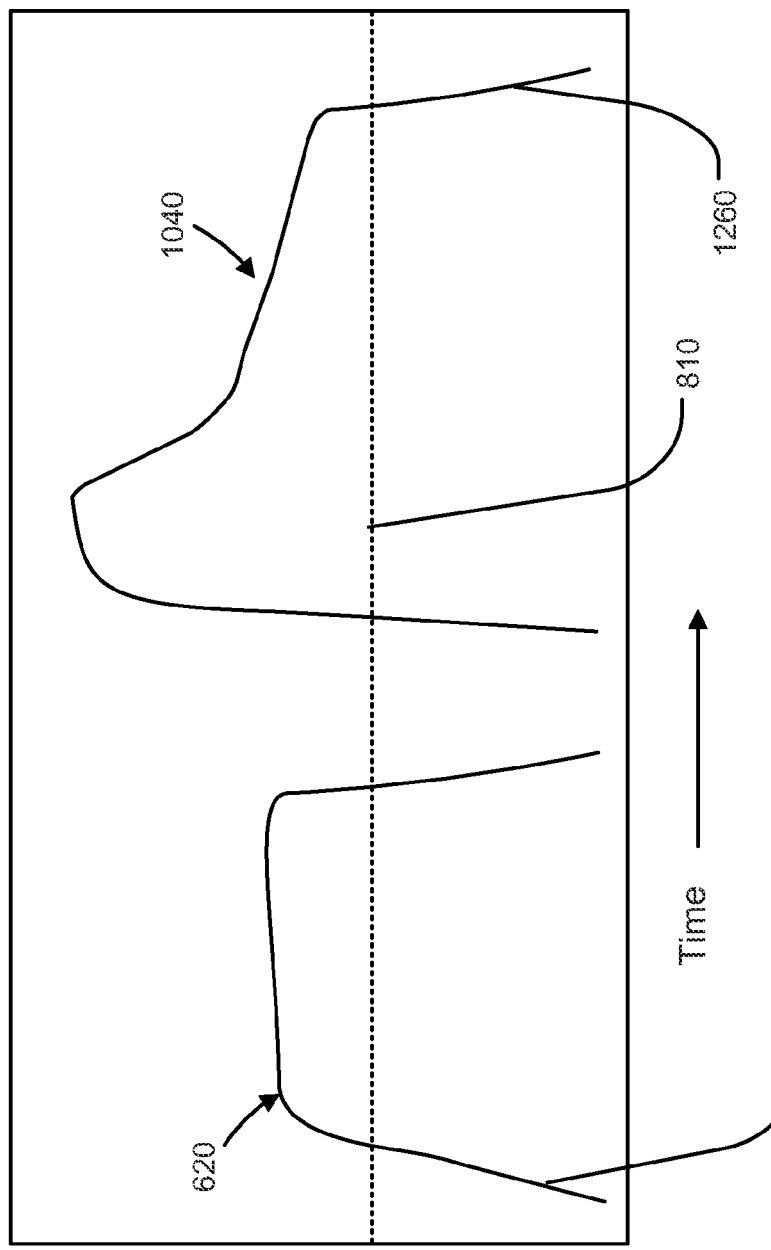
FIG. 12 illustrates heuristic curves of the temperature versus time for portions of the set operation of FIG. 10.

Referring to FIGS. 11 and 12, in the illustrated embodiment the retry (or second) bias arrangement of step 1040 comprises applying a voltage $V_{WL\text{-}RETRY}$ to word line 558, and applying a voltage pulse to the bit line 560 having a shape with initial pulse height of $V_{HIGH}$ and a trailing edge in which the voltage on the bit line 560 decreases with time as shown. The voltage pulse is sufficient to breakthrough the high resistance layer and induces current to flow in path 580 and provide energy to the phase change material of memory element 548.

As represented heuristically in curve 1260 of FIG. 12, the pulse shape of the retry bias arrangement is adapted to breakthrough the high resistance layer and create a conduction path. Because of the trailing edge, the pulse shape is also adapted to cause at least a portion of the active region to transition into a crystalline phase, thereby establishing the lower resistance state. As will be understood, the curve 1260 is merely illustrative and the actual shape of the curve 1260 depends upon the properties of the memory cell, the manner in which the subsequent bias arrangement is applied to the memory cell, and the manner in which the phase change material heats up and cools down.

In some embodiments the amount of energy provided to the phase change material in step 1040 is sufficient to melt the active region of the phase change material and to cause a transition of at least an active region into a crystalline phase. In some alternative embodiments the energy provided to the phase change material in step 1040 is sufficient melt a portion of the phase change material greater than the active region, which may be useful for overcoming the set failure caused by compositional changes of the phase change material within the active region.

In the illustrated embodiment of FIGS. 10-12, the retry bias arrangement of step 1040 comprises a single pulse as shown applied to the bit line 560, although it will be understood that other retry bias arrangements can alternatively be used. More generally, the retry bias arrangement of step 1040 may comprise a set of one or more pulses applied to the bit line 560 and/or word line 558 and/or source line 554 to induce current flow in path 580. The number of pulses and the pulse shapes, including the voltage levels and pulse times, of the subsequent bias arrangement can be determined empirically for each embodiment.

In the set operations 600, 1000 of FIGS. 6 and 10 the description refers to a single memory cell being programmed, although it will be understood that the set operations described herein are also applicable to programming a plurality of memory cells.

Figure 13:
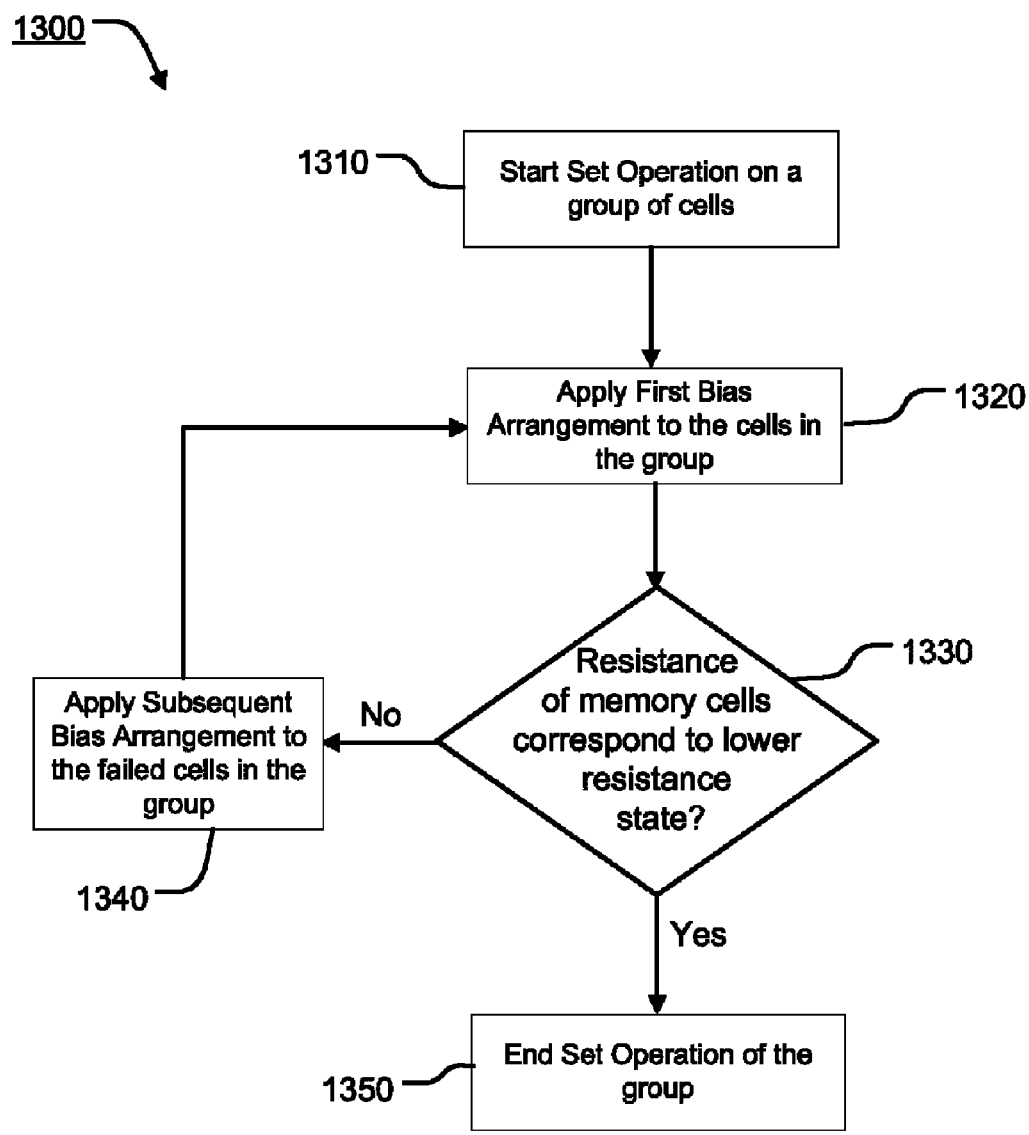
FIG. 13 is a flow diagram of an embodiment of a set operation for programming a group of memory cells from a higher resistance state to a lower resistance state.

FIG. 13 illustrates an embodiment of set operation 1300 on a group of cells of array 405. In the following discussion the various bias arrangements can be implemented as described above including using pulses such as those described above, and thus a discussion of the various pulses and the bias arrangements of the set operation 1300 will not be repeated here.

The set operation 1300 for a group of memory cells of array 405 begins at step 1310. Step 1310 may include, or in some embodiments be preceded by, a read operation.

Next at step 1320 a first bias arrangement is applied to the group of memory cells to establish the lower resistance state in the memory cells.

At step 1330 the resistances of the memory cells are read to determine whether memory cells in the group of memory cells have respective resistances corresponding to the lower resistance state.

For memory cells in the group of memory cells not having a resistance corresponding to the lower resistance state, those memory cells have experienced a set failure and a retry (or second) bias arrangement is applied to those failed memory cells.

In the illustrated embodiment of FIG. 13, the retry bias arrangement of the set operation 1300 begins at step 1340 where a subsequent bias arrangement is applied to the memory cell.

Next, the retry bias arrangement of the set operation 1300 continues back to step 1320 where the first bias arrangement is applied to those failed memory cells.

The set operation 1300 then continues to step 1330 to determine whether the failed memory cells have a resistance corresponding to the lower resistance state. The set operation continues in the loop of iteratively applying the retry bias arrangement (steps 1340, 1320) to memory cells which again fail step 1330 and determining whether the failed memory cells from the preceding step 1330 have a resistance corresponding to the lower resistance state (step 1330) until the resistance of the memory cells corresponds to the lower resistance state, or until a maximum number of retries are made. If in step 1330 it is determined that each of the memory cells in the group has a resistance corresponding to the lower resistance state, the set operation terminates at step 1350.

In the set operation of FIG. 13, the retry bias arrangement comprises the subsequent bias arrangement of step 1340 combined with the first bias arrangement of step 1320. Alternatively, similar to the discussion above with respect to FIG. 10, the retry bias arrangement in some embodiments does not include the set bias arrangement of step 1320, and instead includes the function of setting the group of failed memory cells.

Memory devices and methods for operating such devices described herein address the set failure mode and result in improved endurance, reliability and improved data storage performance. Set operations described herein provide lower energy to the phase change material of memory cells to establish the lower resistance state and only apply higher energy to the phase change material when the lower energy is insufficient to set the memory cell. Thus, compared to melt-and-anneal set methods, set operations described herein reduce the amount of high current operations and thus improve the reliability of the memory cells.

Embodiments of the memory cells described herein include phase change based memory materials, including chalcogenide based materials and other materials, for the memory elements. Chalcogens include any of the four elements oxygen (O), sulfur (S), selenium (Se), and tellurium (Te), forming part of group VIA of the periodic table. Chalcogenides comprise compounds of a chalcogen with a more electropositive element or radical. Chalcogenide alloys comprise combinations of chalcogenides with other materials such as transition metals. A chalcogenide alloy usually contains one or more elements from group IVA of the periodic table of elements, such as germanium (Ge) and tin (Sn). Often, chalcogenide alloys include combinations including one or more of antimony (Sb), gallium (Ga), indium (In), and silver (Ag). Many phase change based memory materials have been described in technical literature, including alloys of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable. The compositions can be characterized as $Te_aGe_bSb_{100-(a+b)}$. One researcher has described the most useful alloys as having an average concentration of Te in the deposited materials well below 70%, typically below about 60% and ranged in general from as low as about 23% up to about 58% Te and most preferably about 48% to 58% Te. Concentrations of Ge were above about 5% and ranged from a low of about 8% to about 30% average in the material, remaining generally below 50%. Most preferably, concentrations of Ge ranged from about 8% to about 40%. The remainder of the principal constituent elements in this composition was Sb. These percentages are atomic percentages that total 100% of the atoms of the constituent elements. (Ovshinsky 5,687,112 patent, cols. 10-11.) Particular alloys evaluated by another researcher include Ge2Sb2Te5, GeSb2Te4 and GeSb4Te7 (Noboru Yamada, "Potential of Ge—Sb—Te Phase-Change Optical Disks for High-Data-Rate Recording", SPIE v.3109, pp. 28-37 (1997).) More generally, a transition metal such as chromium (Cr), iron (Fe), nickel (Ni), niobium (Nb), palladium (Pd), platinum (Pt) and mixtures or alloys thereof may be combined with Ge/Sb/Te to form a phase change alloy that has programmable resistive properties. Specific examples of memory materials that may be useful are given in Ovshinsky '112 at columns 11-13, which examples are hereby incorporated by reference.

Chalcogenides and other phase change materials are doped with impurities in some embodiments to modify conductivity, transition temperature, melting temperature, and other properties of memory elements using the doped chalcogenides. Representative impurities used for doping chalcogenides include nitrogen, silicon, oxygen, silicon dioxide, silicon nitride, copper, silver, gold, aluminum, aluminum oxide, tantalum, tantalum oxide, tantalum nitride, titanium and titanium oxide. See, e.g., U.S. Pat. No. 6,800,504, and U.S. Patent Application Publication No. U.S. 2005/0029502.

Phase change alloys are capable of being switched between a first structural state in which the material is in a generally amorphous solid phase, and a second structural state in which the material is in a generally crystalline solid phase in its local order in the active channel region of the cell. These alloys are at least biostable. The term amorphous is used to refer to a relatively less ordered structure, more disordered than a single crystal, which has the detectable characteristics such as higher electrical resistivity than the crystalline phase. The term crystalline is used to refer to a relatively more ordered structure, more ordered than in an amorphous structure, which has detectable characteristics such as lower electrical resistivity than the amorphous phase. Typically, phase change materials may be electrically switched between different detectable states of local order across the spectrum between completely amorphous and completely crystalline states. Other material characteristics affected by the change between amorphous and crystalline phases include atomic order, free electron density and activation energy. The material may be switched either into different solid phases or into mixtures of two or more solid phases, providing a gray scale between completely amorphous and completely crystalline states. The electrical properties in the material may vary accordingly.

Phase change alloys can be changed from one phase state to another by application of electrical pulses. It has been observed that a shorter, higher amplitude pulse tends to change the phase change material to a generally amorphous state. A longer, lower amplitude pulse tends to change the phase change material to a generally crystalline state. The energy in a shorter, higher amplitude pulse is high enough to allow for bonds of the crystalline structure to be broken and short enough to prevent the atoms from realigning into a crystalline state. Appropriate profiles for pulses can be determined, without undue experimentation, specifically adapted to a particular phase change alloy. In following sections of the disclosure, the phase change material is referred to as GST, and it will be understood that other types of phase change materials can be used. A material useful for implementation of a PCRAM described herein is $Ge_2Sb_2Te_5$.

An exemplary method for forming chalcogenide material uses chemical vapor deposition CVD such as that disclosed in US Publication No 2006/0172067 entitled "Chemical Vapor Deposition of Chalcogenide Materials", which is incorporated by reference herein.

A post-deposition annealing treatment in a vacuum or in an N2 ambient is optionally performed to improve the crystallize state of chalcogenide material. The annealing temperature typically ranges from 100° C. to 400° C. with an anneal time of less than 30 minutes.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A method for operating a memory cell being programmable to a plurality of resistance states including a high resistance state and a lower resistance state, the method comprising:
    applying a first bias arrangement to the memory cell to establish the lower resistance state, the first bias arrangement comprising a first voltage pulse; and
    if the memory cell is not in the lower resistance state, then applying a second bias arrangement to the memory cell to establish the lower resistance state, the second bias arrangement comprising a second voltage pulse having a pulse height greater than that of the first voltage pulse.

2. The method of claim 1, wherein the second bias arrangement is sufficient to breakthrough a high resistance layer within an electrical conduction path of the memory cell.

3. The method of claim 1, wherein the memory cell comprises a programmable resistance material, and wherein applying the second bias arrangement comprises:
    applying the second voltage pulse across the programmable resistance material; and
    after applying the second voltage pulse, applying a voltage pulse equivalent to first voltage pulse across the programmable resistance material.

4. The method of claim 1, wherein the memory cell comprises a phase change material, and the second voltage pulse is sufficient to melt an active region of the phase change material.

5. The method of claim 1, wherein the memory cell comprises a phase change material, and the second voltage pulse has a pulse shape adapted to melt at least an active region of the phase change material and to cause a transition of at least a portion of the active region into a crystalline phase.

6. A method for operating a memory cell being programmable to a plurality of resistance states including a high resistance state and a lower resistance state, the method comprising:
    applying a first bias arrangement to the memory cell to establish the lower resistance state, the first bias arrangement comprising a first voltage pulse; and
    if the memory cell is not in the lower resistance state, then applying a second bias arrangement to the memory cell to establish the lower resistance state, the second bias arrangement comprising a second voltage pulse having a pulse height greater than that of the first voltage pulse;
    determining whether the memory cell is in the lower resistance state after applying the second bias arrangement to the memory cell; and
    if the memory cell is not in the lower resistance state after applying the second bias arrangement to the memory cell, iteratively applying subsequent bias arrangements to the memory cell and determining whether the memory cell is in the lower resistance state until the memory cell is in the lower resistance state or a predetermined number of retries are made, wherein the subsequent bias arrangements respectively comprise a corresponding voltage pulse having a pulse height greater than that of the first voltage pulse to establish the lower resistance state.

7. The method of claim 6, wherein the applying subsequent bias arrangements to the memory cell comprises applying the second bias arrangement to the memory cell.

8. The method of claim 6, wherein the determining whether the memory cell is in the lower resistance state comprises applying a read bias arrangement to the memory cell and detecting a current in the memory cell, the current in the memory cell corresponding to the resistance state of the memory cell.

9. A method for operating a memory cell being programmable to a plurality of resistance states including a high resistance state and a lower resistance state, the method comprising:
    applying a first bias arrangement to the memory cell to establish the lower resistance state, the first bias arrangement comprising a first voltage pulse; and
    if the memory cell is not in the lower resistance state, then applying a second bias arrangement to the memory cell to establish the lower resistance state the second bias arrangement comprising a second voltage pulse having a pulse height greater than that of the first voltage pulse; and wherein
    the memory cell comprises a programmable resistance material, and an access device having a first terminal coupled a word line and a second terminal coupled to a bit line via the phase change material;
    the applying the first bias arrangement comprises applying a voltage to the word line and applying the first voltage pulse to the bit line to induce a first current through the programmable resistance material; and
    the applying the second bias arrangement to the memory cell comprises applying a voltage to the word line and applying the second voltage pulse to the bit line to induce a second current through the programmable resistance material.

10. The method of claim 9, wherein the second current through the programmable resistance material is less than the first current.

11. A memory device comprising:
    a memory cell being programmable to a plurality of resistance states including a high resistance state and a lower resistance state; and
    bias circuitry adapted to apply bias arrangements to the memory cell, the bias arrangements including:
        a first bias arrangement to establish the lower resistance state, the first bias arrangement comprising a first voltage pulse; and
        a second bias arrangement to establish the lower resistance state if the memory cell is not in the lower resistance state after the first bias arrangement, the second bias arrangement comprising a second voltage pulse having a pulse height greater than that of the first voltage pulse.

12. The memory device of claim 11, wherein the second bias arrangement is sufficient to breakthrough a high resistance layer within an electrical conduction path of the memory cell.

13. The memory device of claim 11, wherein the second bias arrangement comprises a plurality of voltage pulses.

14. The memory device of claim 11, wherein the memory cell comprises a phase change material, and the second voltage pulse is sufficient to melt an active region of the phase change material.

15. The memory device of claim 11, wherein the memory cell comprises a phase change material, and the second voltage pulse has a pulse shape adapted to melt at least an active region of the phase change material and to cause a transition of at least a portion of the active region into a crystalline phase.

16. A memory device comprising:
a memory cell being programmable to a plurality of resistance states including a high resistance state and a lower resistance state; and
bias circuitry adapted to apply bias arrangements to the memory cell, the bias arrangements including:
   a first bias arrangement to establish the lower resistance state, the first bias arrangement comprising a first voltage pulse; and
   a second bias arrangement to establish the lower resistance state if the memory cell is not in the lower resistance state after the first bias arrangement, the second bias arrangement comprising a second voltage pulse having a pulse height greater than that of the first voltage pulse:
wherein the bias arrangements further include:
a read bias arrangement to determine whether the memory cell is in the lower resistance state after the second bias arrangement; and
a subsequent bias arrangement to establish the lower resistance state if the memory cell is not in the lower resistance state after the second bias arrangement, the subsequent bias arrangement comprising a voltage pulse having a pulse height greater than that of the first voltage pulse.

17. The memory device of claim 16, wherein the subsequent bias arrangement comprises the second bias arrangement.

18. A memory device comprising:
a memory cell being programmable to a plurality of resistance states including a high resistance state and a lower resistance state; and
bias circuitry adapted to apply bias arrangements to the memory cell, the bias arrangements including:
   a first bias arrangement to establish the lower resistance state, the first bias arrangement comprising a first voltage pulse; and
   a second bias arrangement to establish the lower resistance state if the memory cell is not in the lower resistance state after the first bias arrangement, the second bias arrangement comprising a second voltage pulse having a pulse height greater than that of the first voltage pulse; wherein:
the memory cell further comprises a programmable resistance material, an access device having a first terminal coupled to a word line and a second terminal coupled to a bit line via the programmable resistance material;
the first bias arrangement comprises a voltage applied to the word line and the first voltage pulse applied to the bit line to induce a first current through the programmable resistance material; and
the second bias arrangement comprises a voltage applied to the word line and the second voltage pulse applied to the bit line to induce a second current through the programmable resistance material.

19. The memory device of claim 18, wherein the second current through the programmable resistance material is less than the first current.

20. A memory device comprising:
a memory cell being programmable to a plurality of resistance states including a high resistance state and a lower resistance state; and
bias circuitry adapted to apply bias arrangements to the memory cell, the bias arrangements including:
   a first bias arrangement to establish the lower resistance state, the first bias arrangement comprising a first voltage pulse; and
   a second bias arrangement to establish the lower resistance state if the memory cell is not in the lower resistance state after the first bias arrangement, the second bias arrangement comprising a second voltage pulse having a pulse height greater than that of the first voltage pulse:
wherein the second bias arrangement comprises:
   the second voltage pulse across the phase change material; and
   after the second voltage pulse, a voltage pulse equivalent to the first voltage pulse across the phase change material.

* * * * *